(12) United States Patent
Woods et al.

(10) Patent No.: US 10,895,421 B2
(45) Date of Patent: Jan. 19, 2021

(54) THERMOELECTRIC FLOW CLOAKING VIA METAMATERIALS

(71) Applicants: Lilia M. Woods, Tampa, FL (US); Troy Stedman, Lutz, FL (US)

(72) Inventors: Lilia M. Woods, Tampa, FL (US); Troy Stedman, Lutz, FL (US)

(73) Assignee: University of South Florida, Alexandria, VA (US)

( * ) Notice: Subject to any disclaimer, the term of this patent is extended or adjusted under 35 U.S.C. 154(b) by 302 days.

(21) Appl. No.: 15/841,051

(22) Filed: Dec. 13, 2017

(65) Prior Publication Data

US 2018/0164050 A1 Jun. 14, 2018

Related U.S. Application Data

(60) Provisional application No. 62/434,159, filed on Dec. 14, 2016.

(51) Int. Cl.

| | |
|---|---|
| *F28F 7/00* | (2006.01) |
| *H01L 31/0216* | (2014.01) |
| *H01L 35/02* | (2006.01) |
| *B32B 18/00* | (2006.01) |
| *H01L 35/00* | (2006.01) |
| *C04B 35/453* | (2006.01) |
| *C04B 35/547* | (2006.01) |
| *C04B 35/01* | (2006.01) |
| *C04B 35/58* | (2006.01) |

(52) U.S. Cl.
CPC ............... *F28F 7/00* (2013.01); *B32B 18/00* (2013.01); *C04B 35/01* (2013.01); *C04B 35/453* (2013.01); *C04B 35/547* (2013.01); *C04B 35/58085* (2013.01); *H01L 31/02167* (2013.01); *H01L 35/00* (2013.01); *H01L 35/02* (2013.01); *B32B 2307/708* (2013.01); *B32B 2457/00* (2013.01); *C04B 2235/3201* (2013.01); *C04B 2235/3217* (2013.01); *C04B 2235/3275* (2013.01); *C04B 2235/3294* (2013.01); *C04B 2235/3298* (2013.01); *C04B 2237/34* (2013.01); *C04B 2237/36* (2013.01); *F28F 2270/00* (2013.01)

(58) Field of Classification Search
CPC .... H01L 31/02167; H01L 35/02; H01L 35/00
See application file for complete search history.

(56) References Cited

U.S. PATENT DOCUMENTS

| | | | |
|---|---|---|---|
| 9,091,750 B1* | 7/2015 | Ruffa | H04K 3/68 |
| 2012/0160292 A1* | 6/2012 | Jang | H01L 35/32 |
| | | | 136/236.1 |
| 2016/0181498 A1* | 6/2016 | Garrity | H01L 35/28 |
| | | | 136/203 |

OTHER PUBLICATIONS

Nguyen, et al., Applied Physics Letters, 2015, 107, 121901 (Year: 2015).*
Tarkhanyan, et al., Journal of Electronic Materials, 2015, 44, 12, 4663-4668 (Year: 2015).*

(Continued)

*Primary Examiner* — Sadie White
(74) *Attorney, Agent, or Firm* — Thomas | Horstemeyer, LLP

(57) ABSTRACT

A thermoelectric cloak including an inner region and an external medium. The inner region has a cloaking effect and is simultaneously invisible from both heat and electric charge fluxes; and heat, electric currents, and gradients in the external medium are unaltered by the cloaking effect of the inner region.

16 Claims, 3 Drawing Sheets
(1 of 3 Drawing Sheet(s) Filed in Color)

(56) References Cited

OTHER PUBLICATIONS

Chen et al., "Cloak for curvilinearly anisotropic media in conduction," Applied Physics Letters, 2008, vol. 93, p. 114103.
Chen et al., "Macroscopic invisibility cloaking of visible light," Nature Communications, 2011, vol. 2, p. 176.
Chen et al., "Transformation media that rotate electromagnetic fields," Applied Physics Letters, 2007, vol. 90, p. 241105.
Chen et al., "Transformation optics and metamaterials," Nature Materials, 2010, vol. 9, p. 387.
Dede et al., "Heat flux cloaking, focusing, and reversal in ultra-thin composites considering conduction-convection effects," Applied Physics Letters, 2013, vol. 103, p. 063501.
Dede et al., "Thermal-composite design optimization for heat flux shielding, focusing, and reversal," Structural and Multidisciplinary Optimization, 2014, vol. 49, p. 59.
Domenicali, "Irreversible Thermodynamics of Thermoelectricity," Reviews of Modern Physics, 1954, vol. 26, pp. 237-275.
Feldhoff, "Thermoelectric Material Tensor Derived from the Onsager-de Groot-Callen Model," Energy Harvesting and Systems, 2015, vol. 2, p. 5.
Greenleaf et al., "Full-Wave Invisibility of Active Devices at All Frequencies," Communications in Mathematical Physics, 2007, vol. 275, p. 749.
Guenneau et al., "Anisotropic conductivity rotates heat," Optics Express, 2013, vol. 21, pp. 6578-6583.
Guenneau et al., "Transformation thermodynamics: cloaking and concentrating heat flux," Optics Express, 2012, vol. 27, pp. 8207-8218.
Han et al., "Homogeneous Thermal Cloak with Constant Conductivity and Tunable Heat Localization," Scientific Reports, 2013, vol. 3, p. 1593.
Hu et al., "Carpet thermal cloak realization based on the refraction law of heat flux," EPL, 2015, vol. 111, p. 54003.
Hu et al., "Examination of the Thermal Cloaking Effectiveness with Layered Engineering Materials," Chinese Physics Letters, 2016, vol. 33, p. 044401.
Huang et al., "Electromagnetic cloaking by layered structure of homogeneous isotropic materials," Optics Express, 2007, vol. 15, p. 11133.
Kadic et al., "Metamaterials beyond electromagnetism," Reports on Progress in Physics, 2013, vol. 76, p. 126501.
Kildishev et al., "Engineering space for light via transformation," Optics Letters, 2008, vol. 33, p. 43.
Leonhardt et al., "Transformation Optics and the Geometry of Light," Progress in Optics, 2008, vol. 53, p. 69.
Leonhardt, "Optical Conformal Mapping," Science, 2006, vol. 312, p. 1777.
Li et al., "A bifunctional cloak using transformation media," Journal of Applied Physics, 2010, vol. 108, p. 074504.
Ma et al., "Experimental Demonstration of a Multiphysics Cloak: Manipulating Heat Flux and Electric Current Simultaneously," Physical Review Letters, 2014, vol. 113, p. 205501.
Moccia et al., "Independent Manipulation of Heat and Electrical Current via Bifunctional Metamaterials," Physical Review X, 2014, vol. 4, p. 021025.
Narayana et al., "DC Magnetic Cloak," Advanced Materials, 2012, vol. 24, p. 71.
Narayana et al., "Heat Flux Manipulation with Engineered Thermal Materials," Physical Review Letters, 2012, vol. 108, p. 214303.
Pendry et al., "Controlling Electromagnetic Fields," Science, 2006, vol. 312, p. 1780.
Pendry et al., "Magnetism from Conductors and Enhanced Nonlinear Phenomena," IEEE Transactions on Microwave Theory and Techniques, 1999, vol. 47, No. 2, p. 2075.
Raza et al., "A multi-cloak bifunctional device," Journal of Applied Physics, 2015, vol. 117, p. 024502.
Raza et al., "Transformation thermodynamics and heat cloaking: a review," Journal of Optics, 2016, vol. 18, p. 044002.
Schittny et al., "Experiments on Transformation Thermodynamics: Molding the Flow of Heat," Physical Review Letters, 2013, vol. 110, p. 195901.
Schurig et al., "Metamaterial Electromagnetic Cloak at Microwave Frequencies," Science, 2006, vol. 314, p. 977.
Shalaev, "Transforming Light," Science, 2008, vol. 322, p. 384.
Silveirinha et al., "Infrared and optical invisibility cloak with plasmonic implants based on scattering cancellation," Physical Review B, 2008, vol. 78, p. 075107.
Smith et al., "Composite Medium with Simultaneously Negative Permeability and Permittivity," Physical Review Letters, 2000, vol. 84, p. 4184.
Soukoulis et al., "Negative Refractive Index at Optical Wavelengths," Science, 2007, vol. 315, p. 47.
Soukoulis et al., "Past achievements and future challenges in the development of three-dimensional photonic metamaterials," Nature Photonics, 2011, vol. 5, p. 523.
Tritt et al., "Thermoelectric Materials, Phenomena, and Applications: A Bird's Eye View," MRS Bulletin, 2006, vol. 31, p. 188.
Wang et al., "Switchable invisibility cloak, anticloak, transparent cloak, superscatterer, and illusion for the Laplace equation," Physical Review B, 2014, vol. 89, p. 165108.
Wood et al., "Directed subwavelength imaging using a layered metal-dielectric system," Physical Review B, 2006, vol. 74, p. 115116.
Xu et al., "Conformal transformation optics," Nature Photonics, 2015, vol. 9, p. 15.
Yang et al., "A Negative Conductivity Material Makes a dc Invisibility Cloak Hide an Object at a Distance," Advanced Functional Materials, 2013, vol. 23, p. 4306.
Yang et al., "dc Electric Invisibility Cloak," Physical Review Letters, 2012, vol. 109, p. 053902.
Yang et al., "Heat flux and temperature field cloaks for arbitrarily shaped objects," Journal of Physics D—Applied Physics, 2013, vol. 46, p. 305102.
Yi et al., "Coherent beam control with an all-dielectric transformation optics based lens," Scientific Reports, 2016, vol. 6, p. 18819.

* cited by examiner

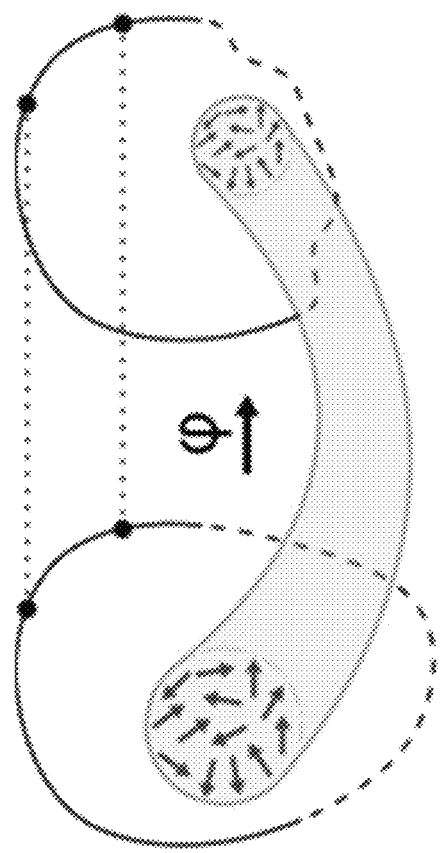
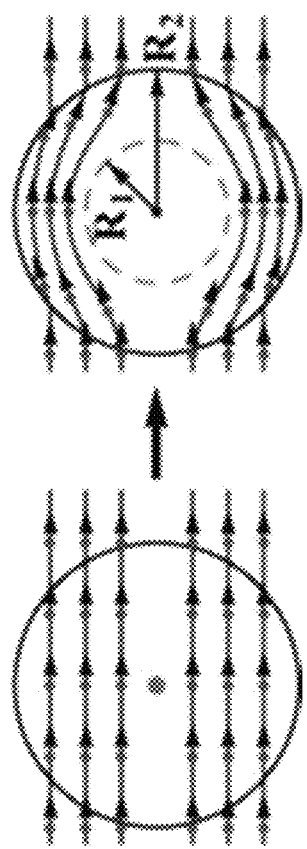
FIG. 1A
FIG. 1B

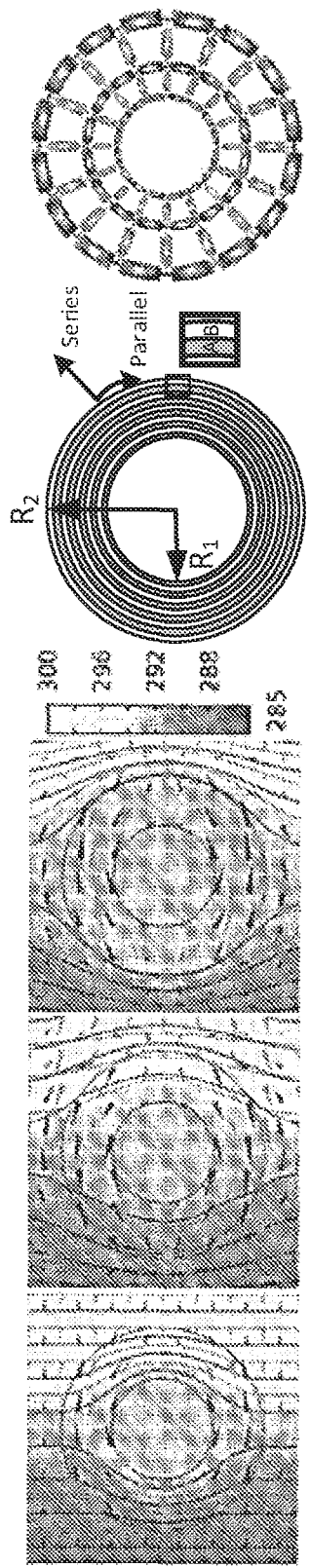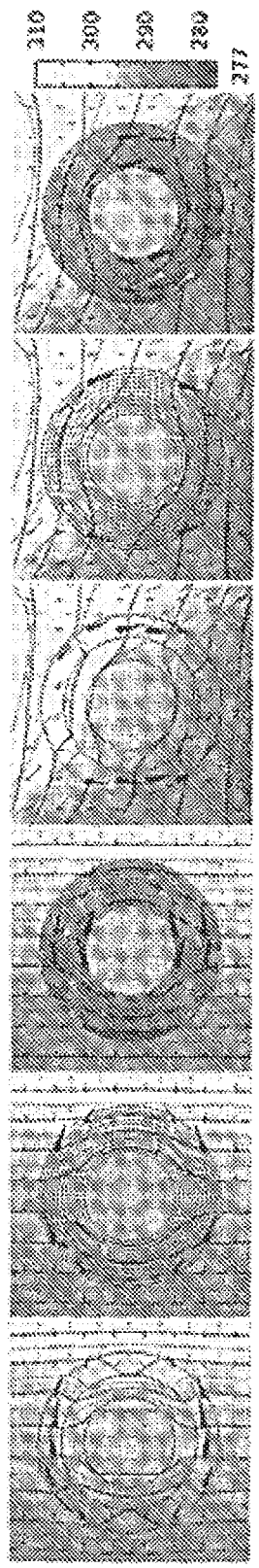

THERMOELECTRIC FLOW CLOAKING VIA METAMATERIALS

CROSS-REFERENCE TO RELATED APPLICATION(S)

This application claims the benefit of U.S. Provisional Patent Application No. 62/434,159, filed on Dec. 14, 2016, which is incorporated herein by reference in its entirety.

STATEMENT REGARDING FEDERALLY SPONSORED RESEARCH OR DEVELOPMENT

This invention was made with government support under grant number DMR 1400957 awarded by the National Science Foundation. The government has certain rights to the invention.

BACKGROUND OF THE INVENTION

The ability to control electromagnetic fields, heat currents, electric currents, and other physical phenomena by coordinate transformation methods has resulted in novel functionalities, such as cloaking, field rotations, and concentration effects. Transformation optics, as the underlying mathematics tool, has proven to be a versatile approach to achieve such unusual outcomes, relying on materials with highly anisotropic and inhomogeneous properties. Most applications and designs thus far have been limited to functionalities within a single physical domain.

SUMMARY OF THE INVENTION

In one embodiment, the invention provides a thermoelectric cloak including an inner region and an external medium. The inner region has a cloaking effect and is simultaneously invisible from both heat and electric charge fluxes; and heat, electric currents, and gradients in the external medium are unaltered by the cloaking effect of the inner region.

Other aspects of the invention will become apparent by consideration of the detailed description and accompanying drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1A illustrates a region of the original space with a boundary being mapped by $\varphi$, a diffeomorphism in the interior, to a subregion in the virtual space. The pushed forward vectors from the tangent space are also schematically denoted. The identity map is shown for a partial boundary (full black line) and it denotes taking boundary points from the original region and mapping them to the same respective boundary points in the subregion.

FIG. 1B illustrates diffeomorphism of a circular cloak (Eq.6). The transformation takes a point (green) from the original space and it moves it radially outward in the virtual space (green dashed curve). In the annular region $R_1<r<R_2$, the originally straight lines curve around the $r=R_1$ circle, making the interior region $r<R_1$ invisible.

FIG. 2A illustrates an ideal thermoelectric (TE) cloak with $$\sigma'_{rr} = \sigma\frac{r-R_1}{r}; \sigma'_{\theta\theta} = \sigma\frac{r}{r-R_1}; \kappa'_{rr} = \kappa\frac{r-R_1}{r}; \kappa'_{\theta\theta} = \kappa\frac{r}{r-R_1};$$

Figures 4A, 4B, 4C, 4D:
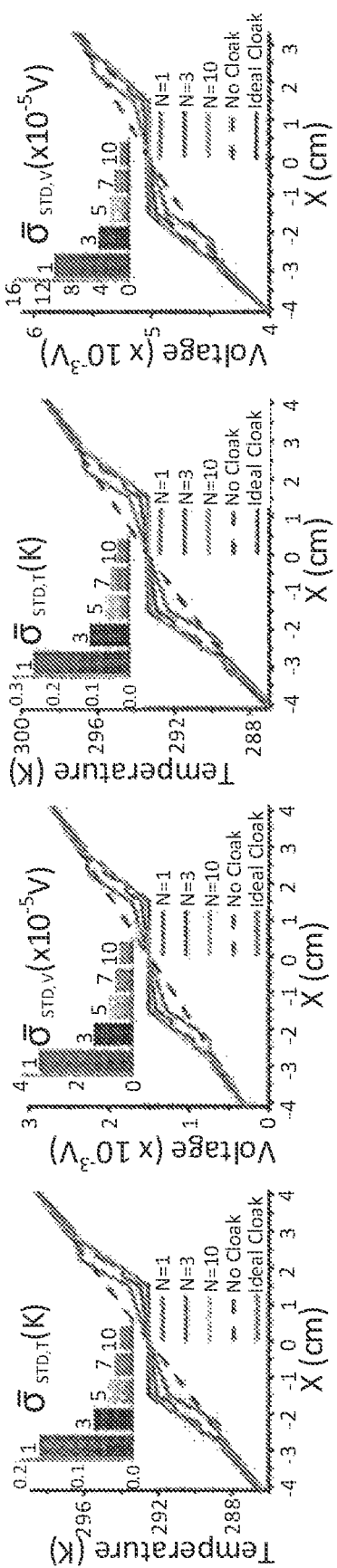

S'=S for the cloak material properties for $R_1<r\leq R_2$ with "TE" boundary conditions for the simulations. The heat and electric currents are shown in blue and black curves, respectively. The blue and black curves are the isotherms and equipotentials, respectively. The background color scheme indicates the temperature profile. Although not shown, the voltage profile has a similar behavior as the temperature profile.

FIG. 2B illustrates an otherwise ideal TE cloak with S'=0.1*S.

FIG. 2C illustrates an otherwise ideal TE cloak with S'=10*S.

FIG. 2D illustrates concentric bilayers for the circular TE cloak of inner radius $R_1$ and outer radius $R_2$. The bilayers have equal thickness and are made up of two different homogeneous and isotropic materials, denoted as A and B.

FIG. 2E is a schematic representation of the electrical conductivity of the layered cloak in terms of a configuration of resistors that are radially in series (red) and azimuthally in parallel (blue) (also denoted in FIG. 2D). Relevant details for the simulations and boundary conditions are provided below in Methods.

FIG. 3A illustrates simulations of a N-bilayered laminate TE cloak with TE boundary conditions for N=1.

FIG. 3B illustrates simulations of a N-bilayered laminate TE cloak with TE boundary conditions for N=5.

FIG. 3C illustrates simulations of a N-bilayered laminate TE cloak with TE boundary conditions for N=10.

FIG. 3D illustrates simulations of a N-bilayered laminate TE cloak with transverse boundary conditions for N=1.

FIG. 3E illustrates simulations of a N-bilayered laminate TE cloak with transverse boundary conditions for N=5.

FIG. 3F illustrates simulations of a N-bilayered laminate TE cloak with transverse boundary conditions for N=10.

FIG. 4A illustrates characteristic profiles as a function of horizontal position x for a horizontal line through the center of the medium for simulations for temperature.

FIG. 4B illustrates characteristic profiles as a function of horizontal position x for a horizontal line through the center of the medium for simulations for voltage under TE boundary conditions.

FIG. 4C illustrates characteristic profiles as a function of horizontal position x for a horizontal line through the center of the medium for simulations for temperature.

FIG. 4D illustrates characteristic profiles as a function of horizontal position x for a horizontal line through the center of the medium for simulations for voltage under transverse boundary conditions for a medium with no cloak, an ideal cloak, and laminate cloaks with N=1, 3, and 10 bilayers.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Herein are disclosed, among other things, transformation optics applied to thermoelectric (TE) phenomena, where thermal and electric flows are coupled via the Seebeck coefficient and Joule heating is taken into account. Using laminates, a thermoelectric cloak capable of hiding objects from thermoelectric flow was designed. The disclosed cloak does not depend on the particular boundary conditions, and it can also operate in different single domain regimes. This cloak constitutes a significant step forward towards controlling and manipulating coupled transport.

Certain embodiments of the disclosed invention provide a method based on transformation optics for unprecedented control of thermoelectric flow. Using fictitious spatial distortions, laminate metamaterials capable of hiding objects from coupled thermal and electric currents were designed. The specific materials properties and the conditions they have to obey are also disclosed.

Definitions

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing of the present invention. All publications, patent applications, patents and other references mentioned herein are incorporated by reference in their entirety. The materials, methods, and examples disclosed herein are illustrative only and not intended to be limiting.

The terms "comprise(s)", "include(s)", "having", "has", "can", "contain(s)", and variants thereof, as used herein, are intended to be open-ended transitional phrases, terms, or words that do not preclude the possibility of additional acts or structures. The singular forms "a", "and", and "the" include plural references unless the context clearly dictates otherwise. The present disclosure also contemplates other embodiments "comprising", "consisting of", and "consisting essentially of", the embodiments or elements presented herein, whether explicitly set forth or not.

The conjunctive term "or" includes any and all combinations of one or more listed elements associated by the conjunctive term. For example, the phrase "an apparatus comprising A or B" may refer to an apparatus including A where B is not present, an apparatus including B where A is not present, or an apparatus where both A and B are present. The phrase "at least one of A, B, . . . and N" or "at least one of" A, B, . . . N, or combinations thereof are defined in the broadest sense to mean one or more elements selected from the group comprising A, B, . . . and N, that is to say, any combination of one or more elements A, B, . . . or N including any one element alone or in combination with one or more of the other elements, which may also include, in combination, additional elements not listed.

The modifier "about" used in connection with a quantity is inclusive of the stated value and has the meaning dictated by the context (for example, it includes at least the degree of error associated with the measurement of the particular quantity). The modifier "about" should also be considered as disclosing the range defined by the absolute values of the two endpoints. For example, the expression "from about 2 to about 4" also discloses the range "from 2 to 4". The term "about" may refer to plus or minus 10% of the indicated number. For example, "about 10%" may indicate a range of 9% to 11%, and "about 1%" may mean from 0.9-1.1. Other meanings of "about" may be apparent from the context, such as rounding off, so, for example "about 1" may also mean from 0.5 to 1.4.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated.

The phrase A "is substantially small compared to" B may have the meaning that a dimension of A is practically negligible compared to the same dimension of B. Alternately, it may mean that a ratio B:A of the dimension in comparison has a value of greater than or equal to about $10^{10}$, about $10^9$, about $10^8$, about $10^7$, about $10^6$, about $10^5$, about $10^4$, about $10^3$, about $10^2$, about 10, about 9, about 8, about 7, about 6, about 5, about 4, about 3, about 2, about 1.75, about 1.5, or about 1.25.

INTRODUCTION

Designing metamaterials (MMs), artificial systems with functionalities unattainable with naturally occurring materials, has far reaching consequences. In the field of optics, man-made composites in which local magnetic dipole moments are induced by oscillating electric currents can create strong magnetic responses at optical frequencies. Other optical MMs having negative magnetic permeabilities and giving rise to negative light phase velocities have also been made.

Optical devices, including invisibility cloaks, field concentrators, and rotators have been designed based on a medium with a spatially changing refractive index that alters light propagation pathways. Some have relied on transformation optics (TO), a mathematical tool that enables molding of the electromagnetic energy flow in desired ways by using fictitious spatial distortions mapped into material composites capable of guiding light. Combined with progress in fabrication techniques, TO has enabled experimental realization of invisibility cloaks (including in the visible light range) and DC magnetic cloaks, as well as new beam steering lenses, for example.

TO techniques have been extended to other areas, where manipulation of heat fluxes, electric currents, mass diffusion, and acoustic propagation, have been demonstrated. There is also evidence for heat flow cloaking, focusing, and reversal.

In a closed system, heat and particle flows, for example, are governed by the laws of conservation of total energy and total number of particles with respective heat and particle diffusion equations. At the same time, the stationary continuity equation for the electric current, which takes into account Ohm's law, is mathematically equivalent to those for heat and particle flows. Therefore, although current flow is associated with the wave-like electromagnetic nature of charge density propagation while heat and particle diffusion propagation are not mediated by waves, the physical behavior of this stationary transport is actually the same.

This point has been explored by constructing bifunctional cloaks capable of guiding both heat and electric currents. Such single devices can be especially useful in applications where the simultaneous control of thermal and electrical phenomena is needed, like in solar cells and thermoelectric devices.

TO techniques have been indispensable in the design of MMs for bifunctional cloaks, which can operate in the simultaneous presence of temperature and voltage gradients. Even though such composites constitute an important step forward to access a multiphysics domain of operation, the neglect of thermoelectric (TE) phenomena, which characterize the coupling of heat and electrical transport, is a major drawback.

The thermodynamic description of this coupled transport includes Joule heating and is captured by the Seebeck coefficient S, a material property describing the production of a voltage drop due to an applied temperature difference. This property reflects the fact that charge carriers transport heat and electricity simultaneously, a manifestation of the charge carrier specific heat. Therefore, coupled heat and electric transport in materials in which the Seebeck coefficient is appreciable cannot be manipulated and controlled by the bifunctional cloaks described in prior work.

In some embodiments, a thermoelectric flow can be molded to achieve effects (such as cloaking, for example) that are not possible to observe with natural materials. As described herein, it is shown that this is possible, and the results are used to obtain a TE cloak capable of hiding objects without disturbing the coupled external heat and electric currents. The embodiments described generalize the diffusive nature of thermodynamic flows by taking into account the coupling between heat and electricity via the Seebeck coefficient.

Such a TE cloak operates under any thermal and electrical boundary conditions. Without wanting to be limited by theory, this is achieved by using the form invariance of the governing laws of energy and charge conservation under coordinate transformations, as required by the TO method. TE cloaking demands materials with highly anisotropic and inhomogeneous properties. Since such materials are not readily available in nature, detailed herein are laminate MMs comprising bilayer composites constructed by determining the specific properties necessary to achieve a cloaking effect.

Basic Equations

The direct conversion of heat into electricity and vice versa constitutes the TE effect, which reflects the production of a charge current flow from a heat current and heat flow due to a voltage difference. These two reciprocal phenomena are the Peltier and Seebeck effects, respectively. In the former, a heat current occurs due to isothermal current flow, while in the latter an electric current is generated due to a temperature difference.

A unified representation of TE phenomena based on governing conservation laws and linear constitutive relations conforming to the general principles of thermodynamics is given by the Onsager-de Groot-Callen theory. In a steady-state with local equilibrium, TE transport is described by taking into consideration the electrochemical potential $\mu=\mu_c+eV$ ($\mu_c$—chemical potential, V—electric potential) and temperature T of the system with governing equations, $$\vec{\nabla}\cdot\vec{J}=0, \vec{\nabla}\cdot\vec{J}_Q=-\vec{\nabla}\mu\cdot J, \quad (1)$$

where J is the electric current density and $J_Q$ is the heat current density. The first equation expresses local steady-state charge conservation, while the second one corresponds to local steady-state energy conservation whose right hand side is the flux due to Joule heating. The constitutive equations are the linear relations from the Onsager-de Groot-Callen theory between fluxes and driving forces due to gradient fields.

The TE driving forces are the electrochemical potential and temperature gradients, while the constitutive equations are $$J=-\vec{\sigma}\cdot\vec{\nabla}\mu-\vec{\sigma}\cdot\vec{S}\cdot\vec{\nabla}T, J_Q=-\vec{\kappa}\cdot\vec{\nabla}T-T\vec{S}^t\cdot\vec{\sigma}\cdot\vec{S}\cdot\vec{\nabla}T-T\vec{S}^t\cdot\vec{\sigma}\cdot\vec{\nabla}\mu, \quad (2)$$

where the electrical conductivity, $\vec{\sigma}$, the thermal conductivity, $\vec{\kappa}$, and the Seebeck coefficient, $\vec{S}$, are Cartesian tensors. The Onsager reciprocal requirement that the electrical and thermal conductivities equal their transpose counterparts, $\vec{\sigma}=\vec{\sigma}^t$ and $\vec{\kappa}=\vec{\kappa}^t$, is accounted for in Eq. (2). One notes that Ohm's law and Fourier's law are the first terms in J and $J_Q$, respectively, and describe the independent production of charge and heat currents under their corresponding gradients. The remaining terms are the TE effects reflecting the coupled charge-heat transport, such that a temperature gradient can lead to a charge carrier flux and that the charge carriers can transport heat flux as well.

Transformation Optics for Thermoelectricity

In this disclosure, cloaking of TE transport is demonstrated, where a region is invisible from both heat and charge fluxes simultaneously in the presence of thermal and electrochemical potential gradients while currents and gradients external to the cloak are unaltered. For this purpose, TO techniques are utilized which explore the form invariance of the underlying equations and maps fictitious distortions into spatially inhomogeneous and anisotropic material properties. These concepts have been effectively extended to find appropriate spatial variations of the material properties to achieve other effects, including flow rotators, inverters, and concentrators in electrodynamics, heat conduction, and acoustics, for example. It is shown herein that TO techniques can be applied to thermoelectricity by relying on the central idea that the governing equations (Eqs. (1,2)) are invariant under coordinate transformations. Thus, the TE fluxes can be modified in a prescribed way (such as cloaking) by making a suitable choice for a particular coordinate transformation r'=r'(r).

The underlying mathematical foundation concerns a region with a boundary in a given medium, commonly referred to as "original space", where materials properties (tensors, in general) along with relevant vector fields, such as charge and heat fluxes, are specified. The vector fields in the region are pushed forward via a smooth mapping based on a diffeomorphism, φ, to some subregion, commonly referred to as "virtual space". This is schematically shown in FIG. 1A, where the original space has a boundary. It is important to note that φ must be the identity mapping on the boundary, a necessary requirement for invisibility cloaking, which ensures that the boundary points in the original space are transformed to the same respective boundary points in the virtual space.

The essence of TO is that the pushforward map is such that the governing and constitutive equations are not only satisfied in the subregion but are also form invariant. The manipulations required by TO include spatial stretching and/or compressing but no spatial tearing to create a new vector field by the pushforward map. To achieve this physically, the materials properties in the subregion must be changed.

FIG. 1B illustrates a particular circular cloak mapping, where the center of a circle is blown up to a larger circle. This distortion results in modified material properties which become highly anisotropic and inhomogeneous. Importantly, integral curves (curves that are tangent to the vector field at every point on the curve) under a global diffeomorphism remain integral curves of the vector fields pushed forward by a diffeomorphism, giving a nice picture of the image of integral curves. Simply put, the vector fields "follow" the distortion as shown in FIG. 1B where straight lines now curve around the cloaked region.

The TO techniques described above are now applied to thermoelectricity. Vectors and material properties are pushed forward via a diffeomorphism applied to a region with an identity map on the boundary, while the governing and constitutive equations must be invariant under such a transformation. This is achieved if the transformed properties (primed) are related to the original ones (unprimed) as $$\vec{\vec{\sigma}}' = \frac{\vec{\vec{A}} \cdot \vec{\vec{\sigma}} \cdot \vec{\vec{A}}^t}{|\vec{\vec{A}}|}, \vec{\vec{\kappa}}' = \frac{\vec{\vec{A}} \cdot \vec{\vec{\kappa}} \cdot \vec{\vec{A}}^t}{|\vec{\vec{A}}|}, \vec{\vec{S}}' = \vec{\vec{A}}^{-t} \cdot \vec{\vec{S}} \cdot \vec{\vec{A}}^t, \quad (3)$$

where $\vec{\vec{A}}$ is the Jacobian matrix with elements $$A^i_j = \frac{\partial x'^i}{\partial x^j}$$

and the transformed coordinates $r'=(x'^1, x'^2, x'^3)$ are related to the original ones $r=(x^1, x^2, x^3)$ by a smooth, invertible function $r'(r)$. $\vec{\vec{A}}^t$ is the matrix transpose of $\vec{\vec{A}}$, $\vec{\vec{A}}^{-t}$ is the inverse of $\vec{\vec{A}}^t$, and $|\vec{\vec{A}}|=\text{Det } \vec{\vec{A}}$. It is important to note that for a homogeneous and isotropic medium, this transformation gives $\vec{\vec{S}}'=\vec{\vec{S}}=S$, which shows that the Seebeck coefficient in this region is unaltered by the transformation. The electric and heat current vector fields together with the electrochemical potential and temperature gradients are pushed forward as $$J' = \frac{\vec{\vec{A}}}{|\vec{\vec{A}}|} \cdot J, \; J'_Q = \frac{\vec{\vec{A}}}{|\vec{\vec{A}}|} \cdot J_Q, \quad (4)$$

$$\vec{\nabla}\mu' = \vec{\vec{A}}^{-t} \cdot \vec{\nabla}\mu, \vec{\nabla}T' = \vec{\vec{A}}^{-t} \cdot \vec{\nabla}T. \quad (5)$$

Circular Thermoelectric Cloak

The relations in Eqs. (3-5) show that a given coordinate transformation $r'(r)$ preserves the form invariance of the governing and constitutive equations, while the physical properties and currents change accordingly. Thus, to achieve effects, such as cloaking, focusing, or reversal of TE transport, one must specify an appropriate coordinate transformation, which will generally result in anisotropic and inhomogeneous material properties according to Eqs. (3).

Here, the case of a 2D circular TE cloak is described, although this TO approach can be generalized to 3D as well. The circular cloak, including an $R_1<r<R_2$ annular region, can hide an object placed within the interior $r<R_1$ from any heat or electric currents in the external medium $r>R_2$ (FIG. 1B). The corresponding diffeomorphism compresses points in the interior of the outer circle of radius $R_2$ into the annular region and is given by $$r' = \left(\frac{R_2 - R_1}{R_1}\right)r + R_1, \; \theta' = \theta. \quad (6)$$

In effect, field lines that enter the cloak are maneuvered around the inner circle with radius $R_1$ and exit the outer circle with radius $R_2$ at the same point that they would if there were no cloak at all. The amplitude of the fields on the outer circle also have the same amplitude that they would if there were no cloak at all. Therefore, the cloaking effect isolates the interior region from any currents and gradients external to the cloak while leaving the currents and gradients in the external medium unaffected by the cloak.

Applying this transformation to an isotropic and homogeneous medium with scalar electrical conductivity σ, thermal conductivity κ, and Seebeck coefficient S, one finds $$\vec{\vec{\sigma}}' = \sigma R(\theta)T(r)R^t(\theta); \vec{\vec{\kappa}}' = \kappa R(\theta)T(r)R^t(\theta); S'=S \quad (7)$$

where, $$R(\theta) = \begin{pmatrix} \cos\theta & -\sin\theta \\ \sin\theta & \cos\theta \end{pmatrix}, \quad (8)$$

$$T(r) = \begin{pmatrix} \frac{r-R_1}{r} & 0 \\ 0 & \frac{r}{r-R_1} \end{pmatrix}.$$

Clearly, the electrical and thermal conductivities of the cloak (Eq. 7) are anisotropic and inhomogeneous. The Seebeck coefficient, on the other hand, is simply that of the medium. To see the cloaking effect due to this transformation, consider the radial and azimuthal conductivities $$\sigma'_{rr} = \sigma\frac{r-R_1}{r} \text{ and } \sigma'_{\theta\theta} = \sigma\frac{r}{r-R_1},$$

respectively. It is noted that $\sigma'_{rr} \rightarrow +0$, while $\sigma'_{\theta\theta} \rightarrow \square$ as $r \rightarrow R^1$ so that the cloak only has an azimuthal electrical response and no radial electrical response near the outer edge of the inner circle. The radial and azimuthal thermal conductivities have the same behavior as their electrical counterparts. Consequently, the electric and heat currents comprising the TE flow are guided around the inner circle.

FIG. 2A shows simulation results for the TE cloak from Eqs. (6-8) obtained using the finite element based COMSOL MULTIPHYSICS package with TE boundary conditions (as detailed below in Methods). It is evident that due to $\kappa'_{rr} \rightarrow 0$, $\sigma'_{rr} \rightarrow +0$ as $r \rightarrow R_1$ no heat and electric currents penetrate the $r<R_1$ cloaked region. After reaching a steady state, a constant temperature and constant potential profile in the cloaked region is achieved. The simulations show that the constant temperature and constant potential inside the cloaked region are $$\frac{T_1 + T_2}{2} \text{ and } \frac{V_1 + V_2}{2},$$

respectively ($T_1$, $V_1$—temperature and potential at the left end of the medium; $T_2$, $V_2$—temperature and potential at the right end of the medium). The same constant temperature behavior has also been found for thermal cloaks under similar simulations conditions.

FIG. 2A further shows that the heat and electric currents, as well as the temperature and potential gradients outside of the cloaking region, $r>R_2$, are the same as those in the isotropic medium if there were no cloak, indicating that these currents and gradients are unperturbed by the presence of the cloak. As a result, an object in the $r<R_1$ region will not experience any effects from the TE flow outside of this region, while the $r>R_2$ region will be insensitive to any TE flow from the interior region.

Further note that $\bar{\kappa}'$ from Eq. (3) is the same as the requirement for the thermal cloak investigated previously. Therefore, it is concluded that the TE cloak here will operate also as a thermal cloak under an applied temperature difference only. The same conclusion can be reached for an electric cloak when only an electric potential difference is applied. Furthermore, the TE cloak will also operate as a bifunctional cloak in the presence of simultaneous temperature and electric potential differences when the medium has negligible Seebeck coefficient. However, if the medium has an appreciable S and the $R_1<r<R_2$ region does not have the Seebeck coefficient according to Eq. (7), there is a significant coupling between the thermal and electric flows and the cloak cannot operate as the bifunctional cloak.

To illustrate this point further, FIGS. 2B-C show simulations for a cloak with $\bar{\kappa}'$, $\bar{\sigma}'$ transforming according to Eqs. (7, 8) and S'=0.1*S and S'=10*S respectively under the TE boundary conditions. One finds that the isotherms and equipotentials are distorted near the outer edge of the cloak and the heat and electric currents differ from those for the ideal cloak in FIG. 2A. The distortions of the currents appear to be greater near the top and bottom edges outside of the cloak for the S'=10*S case, while distortions of the currents for the cloak with S'=0.1*S are especially different near the left and right edges outside of the cloak as compared to FIG. 2A. Also, the electric current in the cloak with S'=0.1*S has reversed direction from the one of the ideal cloak. In effect, the TE transport in FIGS. 2B-C including the electric and heat currents is not cloaked.

Laminate MMs for TE Cloaking

As described earlier, the ideal TE cloak in FIG. 2A requires not only anisotropic and inhomogeneous properties, but it requires having $\bar{\sigma}'$ and $\bar{\kappa}'$ components that grow without bound, making it impossible to realize such a behavior physically, let alone with naturally occurring materials. Therefore, MMs are needed to create a cloak with effective material properties that approximate their ideal pushed forward values (Eq. 7).

To this end, consider a composite comprising concentric bilayers, such that each one is composed of two isotropic and homogeneous layers of equal thickness (denoted as A and B in FIG. 2D). If the thickness of the bilayers is small compared to the inner radius $R_1$, one can approximate the two layers A and B as radially in series and azimuthally in parallel (as schematically shown in FIG. 2E), giving rise to effective material properties according to $$\sigma'_{rr} = 2\frac{\sigma_A\sigma_B}{\sigma_A+\sigma_B}, \sigma'_{\theta\theta} = \frac{\sigma_A+\sigma_B}{2}, \kappa'_{rr} = 2\frac{\kappa_A\kappa_B}{\kappa_A+\kappa_B}, \quad (9)$$
$$\kappa'_{\theta\theta} = \frac{\kappa_A+\kappa_B}{2}$$

$$\sigma'_{rr}S'_{rr} = 2\frac{\sigma_A S_A \sigma_B S_B}{\sigma_A S_A + \sigma_B S_B}, \sigma'_{\theta\theta}S'_{\theta\theta} = \frac{\sigma_A S_A + \sigma_B S_B}{2}. \quad (10)$$

Thus are derived the following bilayer materials properties:

$$\sigma_{A(B)} = \sigma D_{\pm(\mp)}, \kappa_{A(B)} = \kappa D_{\pm(\mp)}, \quad (11)$$

$$S_{A(B)} = S \text{ or } S_{A(B)} = S\frac{D_{\pm(\mp)}}{D_{\mp(\pm)}}, \quad (12)$$

$$D_{\pm} = \frac{r}{r-R_1}\left(1 \pm \sqrt{1-\left(\frac{r-R_1}{r}\right)^2}\right)$$

factor determines the anisotropic nature of the bilayer properties. Noting that $D_+D_-=1$, one finds that if $\sigma_A=\sigma D_+$ then $\sigma_B=\sigma/D_+$. Similar proportionality relations are obtained for $\kappa_{A(B)}$. Interestingly there are two choices for the bilayer Seebeck coefficients. In one case, S must be the same for both layers (thus it must be the same throughout the entire cloak), while in the second case S is determined by the $D_\pm$ ratio such that if $S_A=SD_+^2$ then $S_B=S/D_+^2$. Any combination of choices for the layer material properties in Eqs. (11,12) satisfies the bilayer approximation of the ideal pushed forward material properties in Eq. 7, and the $\pm\to\mp$ correspond to simply swapping the A and B layers. All possible combinations of layer properties are detailed below in Methods, which further shows that the requirements in Eqs. (11,12) are independent of each other.

The bilayer building blocks were then used to construct a MM laminate circular cloak, using the guidelines found in Eqs. (9-12). The laminate was taken to be composed of N concentric bilayers of equal thickness 2 d with $$d = \frac{R_2-R_1}{2N}$$

being the thickness of the $A_n$ and $B_n$ layers comprising the $n^{th}$ bilayer. The properties are $\sigma_{A_n}=\sigma_-((2n-1)d)$, $\kappa_{A_n}=\kappa_-((2n-1)d)$ and $\sigma_{B_n}=\sigma_+(2nd)$, $\kappa_{B_n}=\kappa_+(2nd)$ while $S_{A_n}=S_{B_n}=S$ with n=1, 2, . . . , N, corresponding to the bilayer choice $\{\sigma_-, \sigma_+\}, \{\kappa_-, \kappa_+\}, \{S, S\}$ in Table I. This composite has layers with largely varying thermal and electrical conductivities, while the Seebeck coefficient stays the same.

How the laminate TE cloak functions under different boundary condition is also illustrated here. In addition to results for the steady state simulations for N=1, 5, and 10 under TE boundary conditions, shown in FIGS. 3A-C, results for the same systems under transverse boundary conditions (described below) are shown in FIGS. 3D-F. The blue cones and curves correspond to the heat current and isotherms, respectively, while the black cones and curves correspond to the electric current and equipotentials, respectively. The background color scheme indicates the temperature profile. The overall comparison of these results shows that the cloaking effect is present regardless of the boundary conditions and the performance improves as N increases.

Under TE boundary conditions for N=1 (FIG. 3A) some isotherms penetrate the cloaked $r<R_1$ region, while the isotherms and equipotentials outside the cloak, $r>R_2$, close to the laminate are distorted. This means that the cloaking effect is imperfect and the medium itself has detectable isotherm and equipotential distortions. Also, the temperature and voltage distributions in $r<R_1$ is not uniform, as is the case of an ideal cloak shown in FIG. 2A. Under transverse boundary conditions, for N=1 (FIG. 3D) some isotherms penetrate the cloaked region r<$R_1$, but the pattern for the isotherms and equipotentials is different as compared to FIG. 3A. These unwanted effects for both sets of boundary conditions diminish as N increases due to decreasing of the thickness of the A and B layers, which improves the approximation in Eqs. (9,10).

To further examine the quality of the TE cloak, FIGS. 4A-D show results for the temperature and voltage profiles along a horizontal line passing through the center of medium are shown for several cases, including an ideal cloak, layered cloaks with N=1, 3, and 10 bilayers, and no cloak present for the two sets of boundary conditions. The corresponding standard deviations between a medium with laminate cloaks with N=1, 3, 5, 7, and 10 bilayers and a medium with no cloak, calculated on a grid with M=100×100 points, are shown as inserts in each panel in FIGS. 4A-D. The temperature and potential for the ideal cloak are constant, such that $$T = \frac{T_1 + T_2}{2} \text{ and } V = \frac{V_1 + V_2}{2}.$$

FIGS. 4A-D also show that the largest deviations are found for a laminate composite with N=1 bilayer. As N increases, these T and V vs x profiles approach the ideal behavior, indicating improved cloaking performance. The TE cloaking effect can also be quantified by evaluating the standard temperature and potential deviations of the laminate composites, defined respectively as $$\bar{\sigma}_{STD,T} = \sqrt{\frac{1}{M}\sum_{i=1}^{M}(\Delta T_i^c - \overline{\Delta T^c})^2} \text{ and}$$

$$\bar{\sigma}_{STD,V} = \sqrt{\frac{1}{M}\sum_{i=1}^{M}(\Delta V_i^c - \overline{\Delta V^c})^2}.$$

These are calculated on M grid points for r>$R_2$, such that $\Delta T_i^c = T_i^c - T_i^m$ ($\Delta V_i^c = V_i^c - V_i^m$), $$\overline{\Delta T^c} = \frac{1}{M}\sum_i \Delta T_i^c \left(\overline{\Delta V^c} = \frac{1}{M}\sum_i \Delta V_i^c\right)$$

where $T_i^c$ ($V_i^c$) is the temperature (voltage) with the cloak and $T_i^m$ ($V_i^m$) is the temperature (voltage) without the cloak at the i-th grid point. The results for $\bar{\sigma}_{STD,T}$ and $\bar{\sigma}_{STD,V}$ (shown as inserts in FIGS. 4A-D), indicate that increasing N results in a better cloaking effect approaching the $\bar{\sigma}_{STD,T} = \bar{\sigma}_{STD,V} = 0$ for the ideal cloak.

In view of these results, the laminate cloaks improves as the number of bilayers increases, and at the same time, the cloaking effect is unaffected by the boundary conditions. This is because the temperature and voltage profiles along with the distribution of heat and electric currents in the r>$R_2$ region do not affect the cloaking, emphasizing the generality of the TE cloak obtained via TO. This is in contrast with previous reports of cloaking or other effects obtained via scattering methods, which are strongly dependent on the specific boundary conditions.

The material characteristics are further discussed for a practical realization of TE cloaking. The laminate composite, as shown above, would have largely different electrical and thermal conductivities for the two layers in each bilayer with the largest variation in the innermost layers of the cloak. Although this is similar to the situation of thermal and d electric cloaks, an additional difficulty for the TE laminates arises from the requirements imposed for the Seebeck coefficient. For the N=10 bilayer case (FIGS. 3-4), for example, $\sigma_{A_1} \sim \sigma/40$, $\sigma_{B_1} \sim 40\sigma$, $\kappa_{A_1} \sim \kappa/40$, $\kappa_{B_1} \sim 40\kappa$, and $\sigma_{A_{10}} \sim \sigma/4$, $\sigma_{B_{10}} \sim 4\sigma$, $\kappa_{A_{10}} \sim \kappa/4$, $\kappa_{B_{10}} \sim 4\kappa$. Thus while the electrical and thermal conductivities potentially may encompass values typical for metals and insulators, S is constant throughout. Taking the N=10 case with $S_A = SD_+^2$, $S_B = S/D_+^2$ (the last three columns in the last row of Table 1 in Methods), one finds that $S_{A_1} \sim 1800$ S, $S_{B_1} \sim S/1800$, $S_{A_{10}} \sim 16$ S, $S_{B_{10}} \sim S/16$, while $\sigma_{A_1} \sim \sigma/40$, $\sigma_{B_1} \sim 40\sigma$, $\kappa_{A_1} \sim \kappa/40$, $\kappa_{B_1} \sim 40\kappa$, and $\sigma_{A_{10}} \sim \sigma/4$, $\sigma_{B_{10}} \sim 4\sigma$, $\kappa_{A_{10}} \sim \kappa/4$, $\kappa_{B_{10}} \sim 4\kappa$. For a cloak with N=5 the numerical factors are reduced by 2.

There is a significant variation in S, which may be difficult to satisfy in practice, while the variation in the electrical and thermal conductivities is much less. There are several routes for optimization in finding suitable materials for practical realization of a TE cloak. In addition to the several choices of bilayer combinations essentially arising from the properties being independent of each other, one might consider using a cloak with fewer layers. Even though the cloaking effect may be reduced, the variation in the materials properties is also reduced. Also, the location where Di(r) are evaluated, the radius and thickness of each layer, and materials doping can be further explored.

In certain embodiments, the number of bilayers N may be 1, 2, 3, 4, 5, 6, 7, 8, 9, 10, 11, 12, 13, 14, 15, 16, 17, 18, 19, or 20. In certain other embodiments, the number of bilayers N may be greater than 20.

An explicit construction of the materials properties in terms of the isotropic σ, S, κ for N=2, 10, 20 layers is given in the Examples below. Also given is explicit materials properties of the A,B layers in N=2, 10, 20 laminate for a medium of typical thermoelectrics, such as $Bi_2Te_3$, CoSi, $Na_xCoO_2$, $Sb_2Te_3$, and $Zn_{0.98}Al_{0.2}O$.

Methods

Designing the laminate MM for TE cloaking shows that there are several choices for the transport characteristics of the individual layers, according to Eqs. (1-12). The possible combinations of the bilayer properties are given in Table I.

TABLE I

A list of all possible choices for the material properties of each pair of layers comprising the bilayer laminate cloak.

| $\{\sigma_A, \sigma_B\}$ | $\{\kappa_A, \kappa_B\}$ | $\{S_A, S_B\}$ | $\{\sigma_A, \sigma_B\}$ | $\{\kappa_A, \kappa_B\}$ | $\{S_A, S_B\}$ | $\{\sigma_A, \sigma_B\}$ | $\{\kappa_A, \kappa_B\}$ | $\{S_A, S_B\}$ |
|---|---|---|---|---|---|---|---|---|
| $\{\sigma_+, \sigma_-\}$ | $\{\kappa_+, \kappa_-\}$ | $\{S, S\}$ | $\{\sigma_+, \sigma_-\}$ | $\{\kappa_+, \kappa_-\}$ | $\{S\frac{D_+}{D_-}, S\frac{D_-}{D_+}\}$ | $\{\sigma_+, \sigma_-\}$ | $\{\kappa_-, \kappa_-\}$ | $\{S\frac{D_+}{D_-}, S\frac{D_-}{D_+}\}$ |
| $\{\sigma_+, \sigma_-\}$ | $\{\kappa_-, \kappa_+\}$ | $\{S, S\}$ | $\{\sigma_+, \sigma_-\}$ | $\{\kappa_-, \kappa_+\}$ | $\{S\frac{D_+}{D_-}, S\frac{D_-}{D_+}\}$ | $\{\sigma_+, \sigma_-\}$ | $\{\kappa_-, \kappa_+\}$ | $\{S\frac{D_+}{D_-}, S\frac{D_-}{D_+}\}$ |
| $\{\sigma_-, \sigma_+\}$ | $\{\kappa_+, \kappa_-\}$ | $\{S, S\}$ | $\{\sigma_-, \sigma_+\}$ | $\{\kappa_+, \kappa_-\}$ | $\{S\frac{D_+}{D_-}, S\frac{D_-}{D_+}\}$ | $\{\sigma_-, \sigma_+\}$ | $\{\kappa_+, \kappa_-\}$ | $\{S\frac{D_+}{D_-}, S\frac{D_-}{D_+}\}$ |
| $\{\sigma_-, \sigma_+\}$ | $\{\kappa_-, \kappa_+\}$ | $\{S, S\}$ | $\{\sigma_-, \sigma_+\}$ | $\{\kappa_-, \kappa_+\}$ | $\{S\frac{D_+}{D_-}, S\frac{D_-}{D_+}\}$ | $\{\sigma_-, \sigma_+\}$ | $\{\kappa_-, \kappa_+\}$ | $\{S\frac{D_+}{D_-}, S\frac{D_-}{D_+}\}$ |

The steady state simulations of Eqs. (1-2) were performed using finite element analysis in the COMSOL MULTIPHYSICS package. These governing and constitutive thermoelectric equations were implemented through the built in "Electric Currents" interface and a "Coefficient Form PDE" interface tailored to such equations. The annular cloak region (FIGS. 2-3) was taken to be centered in a 10 cm×10 cm material with $R_1=1.5$ cm and $R_2=3$ cm. The isotropic and homogeneous material was taken to have $$\sigma = 3000\frac{S}{cm}; \kappa = 1\frac{W}{m*K}; S = -200\frac{\mu V}{K},$$

which are similar to those of the common TE material $Bi_2Te_3$.

The TE boundary conditions in FIGS. 2A-C and 3A-D include electrically and thermally insulated top and bottom ends, which is commonly used in TE devices. Also, the left end is electrically grounded and held at a temperature $T_1=285$ K and the right end has an outward normal current density $$J_n = 1\frac{A}{m^2}$$

and held at a temperature $T_2=300$ K. The chemical potential $\mu_c$ is constant throughout the entire material.

The transverse boundary conditions in FIGS. 3E-F included electrically insulated left and right ends while the top and bottom ends are thermally insulated. Also, the temperature of the left end was held at $T_1=285$ K, the temperature of the right end was held at $T_2=300$ K, the bottom end was grounded and, the potential of the top end was held at V=0.01 V.

Examples

It should be kept in mind that the following described embodiments are only presented by way of example and should not be construed as limiting the inventive concept to any particular physical configuration.

Materials Properties Tables

The results below are for a medium with conductivity $\sigma_0$, thermal conductivity $\kappa_0$, and Seebeck coefficient $S_0$.

N=2 Layer
$\{\sigma_+, \sigma_-\}, \{\kappa_+, \kappa_-\}, \{S, S\}$

| Layer | $\sigma/\sigma_0$ | $\kappa/\kappa_0$ | $S/S_0$ |
|---|---|---|---|
| 1 | 5.83 | 5.83 | 1 |
| 2 | 0.268 | 0.268 | 1 |

$\{\sigma_+, \sigma_-\}, \{\kappa_+, \kappa_-\}, \{S, S\}$

| Layer | $\sigma/\sigma_0$ | $\kappa/\kappa_0$ | $S/S_0$ |
|---|---|---|---|
| 1 | 5.83 | 0.172 | 1 |
| 2 | 0.268 | 3.73 | 1 |

$\{\sigma_+, \sigma_-\}, \{\kappa_+, \kappa_-\}, \{S, S\}$

| Layer | $\sigma/\sigma_0$ | $\kappa/\kappa_0$ | $S/S_0$ |
|---|---|---|---|
| 1 | 0.172 | 5.83 | 1 |
| 2 | 3.73 | 0.268 | 1 |

$\{\sigma_+, \sigma_-\}, \{\kappa_+, \kappa_-\}, \{S, S\}$

| Layer | $\sigma/\sigma_0$ | $\kappa/\kappa_0$ | $S/S_0$ |
|---|---|---|---|
| 1 | 0.172 | 0.172 | 1 |
| 2 | 3.73 | 3.73 | 1 |

$\{\sigma_+, \sigma_-\}, \{\kappa_+, \kappa_-\},$ $\{S\frac{D_+}{D_-}, S\frac{D_-}{D_+}\}$

| Layer | $\sigma/\sigma_0$ | $\kappa/\kappa_0$ | $S/S_0$ |
|---|---|---|---|
| 1 | 5.83 | 5.83 | 34 |
| 2 | 0.268 | 0.268 | 0.0718 |

$\{\sigma_+, \sigma_-\}, \{\kappa_+, \kappa_-\},$ $$\left\{s\frac{D_+}{D_-}, s\frac{D_-}{D_+}\right\}$$

| Layer | $\sigma/\sigma_0$ | $\kappa/\kappa_0$ | $S/S_0$ |
|---|---|---|---|
| 1 | 5.83 | 0.172 | 34 |
| 2 | 0.268 | 3.73 | 0.0718 |

$\{\sigma_+, \sigma_-\}, \{\kappa_+, \kappa_-\},$ $$\left\{s\frac{D_+}{D_-}, s\frac{D_-}{D_+}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.172 | 5.83 | 34 | 2 | 3.73 | 0.268 | 0.0718 |

$\{\sigma_+, \sigma_-\}, \{\kappa_+, \kappa_-\},$ $$\left\{s\frac{D_+}{D_-}, s\frac{D_-}{D_+}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.172 | 0.172 | 34 | 2 | 3.73 | 3.73 | 0.0718 |

$\{\sigma_+, \sigma_-\}, \{\kappa_+, \kappa_-\},$ $$\left\{s\frac{D_-}{D_+}, s\frac{D_+}{D_-}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 5.83 | 5.83 | 0.0294 | 2 | 0.268 | 0.268 | 13.9 |

$\{\sigma_+, \sigma_-\}, \{\kappa_+, \kappa_-\},$ $$\left\{s\frac{D_-}{D_+}, s\frac{D_+}{D_-}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 5.83 | 0.172 | 0.0294 | 2 | 0.268 | 3.73 | 13.9 |

$\{\sigma_+, \sigma_-\}, \{\kappa_+, \kappa_-\},$ $$\left\{s\frac{D_-}{D_+}, s\frac{D_+}{D_-}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.172 | 5.83 | 0.0294 | 2 | 3.73 | 0.268 | 13.9 |

$\{\sigma_+, \sigma_-\}, \{\kappa_+, \kappa_-\},$ $$\left\{s\frac{D_-}{D_+}, s\frac{D_+}{D_-}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.172 | 0.172 | 0.0294 | 2 | 3.73 | 3.73 | 13.9 |

N=10 Layers
$\{\sigma_+, \sigma_-\}, \{\kappa_+, \kappa_-\}, \{S, S\}$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 22 | 22 | 1 | 2 | 0.0839 | 0.0839 | 1 |
| 3 | 8.55 | 8.55 | 1 | 4 | 0.146 | 0.146 | 1 |
| 5 | 5.83 | 5.83 | 1 | 6 | 0.195 | 0.195 | 1 |
| 7 | 4.64 | 4.64 | 1 | 8 | 0.234 | 0.234 | 1 |
| 9 | 3.97 | 3.97 | 1 | 10 | 0.268 | 0.268 | 1 |

$\{\sigma_+, \sigma_-\}, \{\kappa_+, \kappa_-\}, \{S, S\}$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 22 | 0.0455 | 1 | 2 | 0.0839 | 11.9 | 1 |
| 3 | 8.55 | 0.117 | 1 | 4 | 0.146 | 6.85 | 1 |
| 5 | 5.83 | 0.172 | 1 | 6 | 0.195 | 5.14 | 1 |
| 7 | 4.64 | 0.215 | 1 | 8 | 0.234 | 4.27 | 1 |
| 9 | 3.97 | 0.252 | 1 | 10 | 0.268 | 3.73 | 1 |

$\{\sigma_+, \sigma_-\}, \{\kappa_+, \kappa_-\}, \{S, S\}$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.0455 | 22 | 1 | 2 | 11.9 | 0.0839 | 1 |
| 3 | 0.117 | 8.55 | 1 | 4 | 6.85 | 0.146 | 1 |
| 5 | 0.172 | 5.83 | 1 | 6 | 5.14 | 0.195 | 1 |
| 7 | 0.215 | 4.64 | 1 | 8 | 4.27 | 0.234 | 1 |
| 9 | 0.252 | 3.97 | 1 | 10 | 3.73 | 0.268 | I |

$\{\sigma_+, \sigma_-\}, \{\kappa_+, \kappa_-\}, \{S, S\}$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.0455 | 0.0455 | 1 | 2 | 11.9 | 11.9 | 1 |
| 3 | 0.117 | 0.117 | 1 | 4 | 6.85 | 6.85 | 1 |
| 5 | 0.172 | 0.172 | 1 | 6 | 5.14 | 5.14 | 1 |
| 7 | 0.215 | 0.215 | 1 | 8 | 4.27 | 4.27 | 1 |
| 9 | 0.252 | 0.252 | 1 | 10 | 3.73 | 3.73 | 1 |

$\{\sigma_+, \sigma_-\}, \{\kappa_+, \kappa_-\},$ $$\left\{s\frac{D_+}{D_-}, s\frac{D_-}{D_+}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 22 | 0.0455 | 482 | 2 | 0.0839 | 11.9 | 0.00704 |
| 3 | 8.55 | 0.117 | 73.1 | 4 | 0.146 | 6.85 | 0.0213 |
| 5 | 5.83 | 0.172 | 34 | 6 | 0.195 | 5.14 | 0.0379 |
| 7 | 4.64 | 0.215 | 21.5 | 8 | 0.234 | 4.27 | 0.055 |
| 9 | 3.97 | 0.252 | 15.8 | 10 | 0.268 | 3.73 | 0.0718 |

$\{\sigma_+, \sigma_-\}, \{\kappa_+, \kappa_-\},$ $$\left\{s\frac{D_+}{D_-}, s\frac{D_-}{D_+}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 22 | 0.0455 | 482 | 2 | 0.0839 | 11.9 | 0.00704 |
| 3 | 8.55 | 0.117 | 73.1 | 4 | 0.146 | 6.85 | 0.0213 |
| 5 | 5.83 | 0.172 | 34 | 6 | 0.195 | 5.14 | 0.0379 |
| 7 | 4.64 | 0.215 | 21.5 | 8 | 0.234 | 4.27 | 0.055 |
| 9 | 3.97 | 0.252 | 15.8 | 10 | 0.268 | 3.73 | 0.0718 |

$\{\sigma_+, \sigma_-\}, \{\kappa_+, \kappa_-\},$ $$\left\{s\frac{D_+}{D_-}, s\frac{D_-}{D_+}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.0455 | 22 | 482 | 2 | 11.9 | 0.0839 | 0.00704 |
| 3 | 0.117 | 8.55 | 73.1 | 4 | 6.85 | 0.146 | 0.0213 |
| 5 | 0.172 | 5.83 | 34 | 6 | 5.14 | 0.195 | 0.0379 |
| 7 | 0.215 | 4.64 | 21.5 | 8 | 4.27 | 0.234 | 0.055 |
| 9 | 0.252 | 3.97 | 15.8 | 10 | 3.73 | 0.268 | 0.0718 |

$\{\sigma_+, \sigma_-\}, \{\kappa_+, \kappa_-\},$ $$\left\{s\frac{D_+}{D_-}, s\frac{D_-}{D_+}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.0455 | 0.0455 | 482 | 2 | 11.9 | 11.9 | 0.00704 |
| 3 | 0.117 | 0.117 | 73.1 | 4 | 6.85 | 6.85 | 0.0213 |
| 5 | 0.172 | 0.172 | 34 | 6 | 5.14 | 5.14 | 0.0379 |
| 7 | 0.215 | 0.215 | 21.5 | 8 | 4.27 | 4.27 | 0.055 |
| 9 | 0.252 | 0.252 | 15.8 | 10 | 3.73 | 3.73 | 0.0718 |

$\{\sigma_+, \sigma_-\}, \{\kappa_+, \kappa_-\},$ $$\left\{s\frac{D_-}{D_+}, s\frac{D_+}{D_-}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 22 | 22 | 0.00207 | 2 | 0.0839 | 0.0839 | 142 |
| 3 | 8.55 | 8.55 | 0.0137 | 4 | 0.146 | 0.146 | 47 |
| 5 | 5.83 | 5.83 | 0.0294 | 6 | 0.195 | 0.195 | 26.4 |
| 7 | 4.64 | 4.64 | 0.0464 | 8 | 0.234 | 0.234 | 18.2 |
| 9 | 3.97 | 3.97 | 0.0634 | 10 | 0.268 | 0.268 | 13.9 |

$\{\sigma_+, \sigma_-\}, \{\kappa_+, \kappa_-\},$ $$\left\{s\frac{D_-}{D_+}, s\frac{D_+}{D_-}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 22 | 0.0455 | 0.00207 | 2 | 0.0839 | 11.9 | 142 |
| 3 | 8.55 | 0.117 | 0.0137 | 4 | 0.146 | 6.85 | 47 |
| 5 | 5.83 | 0.172 | 0.0294 | 6 | 0.195 | 5.14 | 26.4 |
| 7 | 4.64 | 0.215 | 0.0464 | 8 | 0.234 | 4.27 | 18.2 |
| 9 | 3.97 | 0.252 | 0.0634 | 10 | 0.268 | 3.73 | 13.9 |

$\{\sigma_+, \sigma_-\}, \{\kappa_+, \kappa_-\},$ $$\left\{s\frac{D_-}{D_+}, s\frac{D_+}{D_-}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.0455 | 22 | 0.00207 | 2 | 11.9 | 0.0839 | 142 |
| 3 | 0.117 | 8.55 | 0.0137 | 4 | 6.85 | 0.146 | 47 |
| 5 | 0.172 | 5.83 | 0.0294 | 6 | 5.14 | 0.195 | 26.4 |
| 7 | 0.215 | 4.64 | 0.0464 | 8 | 4.27 | 0.234 | 18.2 |
| 9 | 0.252 | 3.97 | 0.0634 | 10 | 3.73 | 0.268 | 13.9 |

$\{\sigma_+, \sigma_-\}, \{\kappa_+, \kappa_-\},$ $$\left\{s\frac{D_-}{D_+}, s\frac{D_+}{D_-}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.0455 | 0.0455 | 0.00207 | 2 | 11.9 | 11.9 | 142 |
| 3 | 0.117 | 0.117 | 0.0137 | 4 | 6.85 | 6.85 | 47 |
| 5 | 0.172 | 0.172 | 0.0294 | 6 | 5.14 | 5.14 | 26.4 |
| 7 | 0.215 | 0.215 | 0.0464 | 8 | 4.27 | 4.27 | 18.2 |
| 9 | 0.252 | 0.252 | 0.0634 | 10 | 3.73 | 3.73 | 13.9 |

N=20 Layers $\{\sigma_+, \sigma_-\}, \{\kappa_+, \kappa_-\}, \{S, S\}$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 42 | 42 | 1 | 2 | 0.0455 | 0.0455 | 1 |
| 3 | 15.3 | 15.3 | 1 | 4 | 0.0839 | 0.0839 | 1 |
| 5 | 9.9 | 9.9 | 1 | 6 | 0.117 | 0.117 | 1 |
| 7 | 7.58 | 7.58 | 1 | 8 | 0.146 | 0.146 | 1 |
| 9 | 6.29 | 6.29 | 1 | 10 | 0.172 | 0.172 | 1 |
| 11 | 5.45 | 5.45 | 1 | 12 | 0.195 | 0.195 | 1 |
| 13 | 4.87 | 4.87 | 1 | 14 | 0.215 | 0.215 | 1 |
| 15 | 4.44 | 4.44 | 1 | 16 | 0.234 | 0.234 | 1 |
| 17 | 4.11 | 4.11 | 1 | 18 | 0.252 | 0.252 | 1 |
| 19 | 3.85 | 3.85 | 1 | 20 | 0.268 | 0.268 | 1 |

$\{\sigma_+, \sigma_-\}, \{\kappa_+, \kappa_-\}, \{S, S\}$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 42 | 0.0238 | 1 | 2 | 0.0455 | 22 | 1 |
| 3 | 15.3 | 0.0655 | 1 | 4 | 0.0839 | 11.9 | 1 |
| 5 | 9.9 | 0.101 | 1 | 6 | 0.117 | 8.55 | 1 |
| 7 | 7.58 | 0.132 | 1 | 8 | 0.146 | 6.85 | 1 |
| 9 | 6.29 | 0.159 | 1 | 10 | 0.172 | 5.83 | 1 |
| 11 | 5.45 | 0.183 | 1 | 12 | 0.195 | 5.14 | 1 |
| 13 | 4.87 | 0.205 | 1 | 14 | 0.215 | 4.64 | 1 |
| 15 | 4.44 | 0.225 | 1 | 16 | 0.234 | 4.27 | 1 |
| 17 | 4.11 | 0.243 | 1 | 18 | 0.252 | 3.97 | 1 |
| 19 | 3.85 | 0.26 | 1 | 20 | 0.268 | 3.73 | 1 |

$\{\sigma_+, \sigma_-\}, \{\kappa_+, \kappa_-\}, \{S, S\}$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.0238 | 42 | 1 | 2 | 22 | 0.0455 | 1 |
| 3 | 0.0655 | 15.3 | 1 | 4 | 11.9 | 0.0839 | 1 |
| 5 | 0.101 | 9.9 | 1 | 6 | 8.55 | 0.117 | 1 |
| 7 | 0.132 | 7.58 | 1 | 8 | 6.85 | 0.146 | 1 |
| 9 | 0.159 | 6.29 | 1 | 10 | 5.83 | 0.172 | 1 |
| 11 | 0.183 | 5.45 | 1 | 12 | 5.14 | 0.195 | 1 |
| 13 | 0.205 | 4.87 | 1 | 14 | 4.64 | 0.215 | 1 |
| 15 | 0.225 | 4.44 | 1 | 16 | 4.27 | 0.234 | 1 |
| 17 | 0.243 | 4.11 | 1 | 18 | 3.97 | 0.252 | 1 |
| 19 | 0.26 | 3.85 | 1 | 20 | 3.73 | 0.268 | 1 |

$\{\sigma_+, \sigma_-\}, \{\kappa_+, \kappa_-\}, \{S, S\}$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.0238 | 0.0238 | 1 | 2 | 22 | 22 | 1 |
| 3 | 0.0655 | 0.0655 | 1 | 4 | 11.9 | 11.9 | 1 |
| 5 | 0.101 | 0.101 | 1 | 6 | 8.55 | 8.55 | 1 |
| 7 | 0.132 | 0.132 | 1 | 8 | 6.85 | 6.85 | 1 |
| 9 | 0.159 | 0.159 | 1 | 10 | 5.83 | 5.83 | 1 |
| 11 | 0.183 | 0.183 | 1 | 12 | 5.14 | 5.14 | 1 |
| 13 | 0.205 | 0.205 | 1 | 14 | 4.64 | 4.64 | 1 |
| 15 | 0.225 | 0.225 | 1 | 16 | 4.27 | 4.27 | 1 |
| 17 | 0.243 | 0.243 | 1 | 18 | 3.97 | 3.97 | 1 |
| 19 | 0.26 | 0.26 | 1 | 20 | 3.73 | 3.73 | 1 |

$\{\sigma_+, \sigma_-\}, \{\kappa_+, \kappa_-\},$ $$\left\{S\frac{D_+}{D_-}, S\frac{D_-}{D_+}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 42 | 42 | 1.76E+03 | 2 | 0.0455 | 0.0455 | 0.00207 |
| 3 | 15.3 | 15.3 | 233 | 4 | 0.0839 | 0.0839 | 0.00704 |
| 5 | 9.9 | 9.9 | 98 | 6 | 0.117 | 0.117 | 0.0137 |
| 7 | 7.58 | 7.58 | 57.5 | 8 | 0.146 | 0.146 | 0.0213 |
| 9 | 6.29 | 6.29 | 39.5 | 10 | 0.172 | 0.172 | 0.0294 |
| 11 | 5.45 | 5.45 | 29.7 | 12 | 0.195 | 0.195 | 0.0379 |
| 13 | 4.87 | 4.87 | 23.7 | 14 | 0.215 | 0.215 | 0.0464 |
| 15 | 4.44 | 4.44 | 19.7 | 16 | 0.234 | 0.234 | 0.055 |
| 17 | 4.11 | 4.11 | 16.9 | 18 | 0.252 | 0.252 | 0.0634 |
| 19 | 3.85 | 3.85 | 14.8 | 20 | 0.268 | 0.268 | 0.0718 |

$\{\sigma_+, \sigma_-\}, \{\kappa_+, \kappa_-\},$ $$\left\{S\frac{D_+}{D_-}, S\frac{D_-}{D_+}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 42 | 0.0238 | 1.76E+03 | 2 | 0.0455 | 22 | 0.00207 |
| 3 | 15.3 | 0.0655 | 233 | 4 | 0.0839 | 11.9 | 0.00704 |
| 5 | 9.9 | 0.101 | 98 | 6 | 0.117 | 8.55 | 0.0137 |
| 7 | 7.58 | 0.132 | 57.5 | 8 | 0.146 | 6.85 | 0.0213 |
| 9 | 6.29 | 0.159 | 39.5 | 10 | 0.172 | 5.83 | 0.0294 |
| 11 | 5.45 | 0.183 | 29.7 | 12 | 0.195 | 5.14 | 0.0379 |
| 13 | 4.87 | 0.205 | 23.7 | 14 | 0.215 | 4.64 | 0.0464 |
| 15 | 4.44 | 0.225 | 19.7 | 16 | 0.234 | 4.27 | 0.055 |
| 17 | 4.11 | 0.243 | 16.9 | 18 | 0.252 | 3.97 | 0.0634 |
| 19 | 3.85 | 0.26 | 14.8 | 20 | 0.268 | 3.73 | 0.0718 |

$\{\sigma_+, \sigma_-\}, \{\kappa_+, \kappa_-\},$ $$\left\{S\frac{D_+}{D_-}, S\frac{D_-}{D_+}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.0238 | 42 | 1.76E+03 | 2 | 22 | 0.0455 | 0.00207 |
| 3 | 0.0655 | 15.3 | 233 | 4 | 11.9 | 0.0839 | 0.00704 |
| 5 | 0.101 | 9.9 | 98 | 6 | 8.55 | 0.117 | 0.0137 |
| 7 | 0.132 | 7.58 | 57.5 | 8 | 6.85 | 0.146 | 0.0213 |
| 9 | 0.159 | 6.29 | 39.5 | 10 | 5.83 | 0.172 | 0.0294 |
| 11 | 0.183 | 5.45 | 29.7 | 12 | 5.14 | 0.195 | 0.0379 |
| 13 | 0.205 | 4.87 | 23.7 | 14 | 4.64 | 0.215 | 0.0464 |
| 15 | 0.225 | 4.44 | 19.7 | 16 | 4.27 | 0.234 | 0.055 |
| 17 | 0.243 | 4.11 | 16.9 | 18 | 3.97 | 0.252 | 0.0634 |
| 19 | 0.26 | 3.85 | 14.8 | 20 | 3.73 | 0.268 | 0.0718 |

$\{\sigma_+, \sigma_-\}, \{\kappa_+, \kappa_-\},$ $$\left\{S\frac{D_+}{D_-}, S\frac{D_-}{D_+}\right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.0238 | 0.0238 | 1.76E+03 | 2 | 22 | 22 | 0.00207 |
| 3 | 0.0655 | 0.0655 | 233 | 4 | 11.9 | 11.9 | 0.00704 |
| 5 | 0.101 | 0.101 | 98 | 6 | 8.55 | 8.55 | 0.0137 |

-continued

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 7 | 0.132 | 0.132 | 57.5 | 8 | 6.85 | 6.85 | 0.0213 |
| 9 | 0.159 | 0.159 | 39.5 | 10 | 5.83 | 5.83 | 0.0294 |
| 11 | 0.183 | 0.183 | 29.7 | 12 | 5.14 | 5.14 | 0.0379 |
| 13 | 0.205 | 0.205 | 23.7 | 14 | 4.64 | 4.64 | 0.0464 |
| 15 | 0.225 | 0.225 | 19.7 | 16 | 4.27 | 4.27 | 0.055 |
| 17 | 0.243 | 0.243 | 16.9 | 18 | 3.97 | 3.97 | 0.0634 |
| 19 | 0.26 | 0.26 | 14.8 | 20 | 3.73 | 3.73 | 0.0718 |

$\{\sigma_+, \sigma_-\}, \{\kappa_+, \kappa_-\},$ $$\left\{ s\frac{D_-}{D_+}, s\frac{D_+}{D_-} \right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 42 | 42 | 0.000568 | 2 | 0.0455 | 0.0455 | 482 |
| 3 | 15.3 | 15.3 | 0.00429 | 4 | 0.0839 | 0.0839 | 142 |
| 5 | 9.9 | 9.9 | 0.0102 | 6 | 0.117 | 0.117 | 73.1 |
| 7 | 7.58 | 7.58 | 0.0174 | 8 | 0.146 | 0.146 | 47 |
| 9 | 6.29 | 6.29 | 0.0253 | 10 | 0.172 | 0.172 | 34 |
| 11 | 5.45 | 5.45 | 0.0336 | 12 | 0.195 | 0.195 | 26.4 |
| 13 | 4.87 | 4.87 | 0.0421 | 14 | 0.215 | 0.215 | 21.5 |
| 15 | 4.44 | 4.44 | 0.0507 | 16 | 0.234 | 0.234 | 18.2 |
| 17 | 4.11 | 4.11 | 0.0592 | 18 | 0.252 | 0.252 | 15.8 |
| 19 | 3.85 | 3.85 | 0.0676 | 20 | 0.268 | 0.268 | 13.9 |

$\{\sigma_+, \sigma_-\}, \{\kappa_+, \kappa_-\},$ $$\left\{ s\frac{D_-}{D_+}, s\frac{D_+}{D_-} \right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 42 | 0.0238 | 0.000568 | 2 | 0.0455 | 22 | 482 |
| 3 | 15.3 | 0.0655 | 0.00429 | 4 | 0.0839 | 11.9 | 142 |
| 5 | 9.9 | 0.101 | 0.0102 | 6 | 0.117 | 8.55 | 73.1 |
| 7 | 7.58 | 0.132 | 0.0174 | 8 | 0.146 | 6.85 | 47 |
| 9 | 6.29 | 0.159 | 0.0253 | 10 | 0.172 | 5.83 | 34 |
| 11 | 5.45 | 0.183 | 0.0336 | 12 | 0.195 | 5.14 | 26.4 |
| 13 | 4.87 | 0.205 | 0.0421 | 14 | 0.215 | 4.64 | 21.5 |
| 15 | 4.44 | 0.225 | 0.0507 | 16 | 0.234 | 4.27 | 18.2 |
| 17 | 4.11 | 0.243 | 0.0592 | 18 | 0.252 | 3.97 | 15.8 |
| 19 | 3.85 | 0.26 | 0.0676 | 20 | 0.268 | 3.73 | 13.9 |

$\{\sigma_+, \sigma_-\}, \{\kappa_+, \kappa_-\},$ $$\left\{ s\frac{D_-}{D_+}, s\frac{D_+}{D_-} \right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.0238 | 42 | 0.000568 | 2 | 22 | 0.0455 | 482 |
| 3 | 0.0655 | 15.3 | 0.00429 | 4 | 11.9 | 0.0839 | 142 |
| 5 | 0.101 | 9.9 | 0.0102 | 6 | 8.55 | 0.117 | 73.1 |
| 7 | 0.132 | 7.58 | 0.0174 | 8 | 6.85 | 0.146 | 47 |
| 9 | 0.159 | 6.29 | 0.0253 | 10 | 5.83 | 0.172 | 34 |
| 11 | 0.183 | 5.45 | 0.0336 | 12 | 5.14 | 0.195 | 26.4 |
| 13 | 0.205 | 4.87 | 0.0421 | 14 | 4.64 | 0.215 | 21.5 |
| 15 | 0.225 | 4.44 | 0.0507 | 16 | 4.27 | 0.234 | 18.2 |
| 17 | 0.243 | 4.11 | 0.0592 | 18 | 3.97 | 0.252 | 15.8 |
| 19 | 0.26 | 3.85 | 0.0676 | 20 | 3.73 | 0.268 | 13.9 |

$\{\sigma_+, \sigma_-\}, \{\kappa_+, \kappa_-\},$ $$\left\{ s\frac{D_-}{D_+}, s\frac{D_+}{D_-} \right\}$$

| Layer | $\sigma/\sigma_0$ | $\kappa/\kappa_0$ | $S/S_0$ | Layer | $\sigma/\sigma_0$ | $\kappa/\kappa_0$ | $S/S_0$ |
|---|---|---|---|---|---|---|---|
| 1 | 0.0238 | 0.0238 | 0.000568 | 2 | 22 | 22 | 482 |
| 3 | 0.0655 | 0.0655 | 0.00429 | 4 | 11.9 | 11.9 | 142 |
| 5 | 0.101 | 0.101 | 0.0102 | 6 | 8.55 | 8.55 | 73.1 |
| 7 | 0.132 | 0.132 | 0.0174 | 8 | 6.85 | 6.85 | 47 |
| 9 | 0.159 | 0.159 | 0.0253 | 10 | 5.83 | 5.83 | 34 |
| 11 | 0.183 | 0.183 | 0.0336 | 12 | 5.14 | 5.14 | 26.4 |
| 13 | 0.205 | 0.205 | 0.0421 | 14 | 4.64 | 4.64 | 21.5 |
| 15 | 0.225 | 0.225 | 0.0507 | 16 | 4.27 | 4.27 | 18.2 |
| 17 | 0.243 | 0.243 | 0.0592 | 18 | 3.97 | 3.97 | 15.8 |
| 19 | 0.26 | 0.26 | 0.0676 | 20 | 3.73 | 3.73 | 13.9 |

The results below are for $Bi_2Te_3$ with $\sigma=1.1e5$ S/m, $\kappa=1.2$ W/m·K, and $S=-287$ µV/K.

N=20 Layers $\{\sigma_+, \sigma_-\}, \{\kappa_+, \kappa_-\}, \{S, S\}$

| Layer | $\sigma$ (S/m) | $\kappa$ (W/m · K) | S (µV/K) | Layer | $\sigma$ (S/m) | $\kappa$ (W/m · K) | S (µV/K) |
|---|---|---|---|---|---|---|---|
| 1 | 4.62E+06 | 50.4 | −287 | 2 | 5.01E+03 | 0.0547 | −287 |
| 3 | 1.68E+06 | 18.3 | −287 | 4 | 9.23E+03 | 0.101 | −287 |
| 5 | 1.09E+06 | 11.9 | −287 | 6 | 1.29E+04 | 0.14 | −287 |
| 7 | 8.34E+05 | 9.1 | −287 | 8 | 1.60E+04 | 0.175 | −287 |
| 9 | 6.91E+05 | 7.54 | −287 | 10 | 1.89E+04 | 0.206 | −287 |
| 11 | 6.00E+05 | 6.54 | −287 | 12 | 2.14E+04 | 0.234 | −287 |
| 13 | 5.36E+05 | 5.85 | −287 | 14 | 2.37E+04 | 0.259 | −287 |
| 15 | 4.89E+05 | 5.33 | −287 | 16 | 2.58E+04 | 0.281 | −287 |
| 17 | 4.52E+05 | 4.93 | −287 | 18 | 2.77E+04 | 0.302 | −287 |
| 19 | 4.23E+05 | 4.61 | −287 | 20 | 2.95E+04 | 0.322 | −287 |

$\{\sigma_+, \sigma_-\}, \{\kappa_+, \kappa_-\}, \{S, S\}$

| Layer | σ (S/m) | κ (W/m·K) | S (μV/K) | Layer | σ (S/m) | κ (W/m·K) | S (μV/K) |
|---|---|---|---|---|---|---|---|
| 1 | 2.62E+03 | 0.0286 | −287 | 2 | 2.41E+06 | 26.3 | −287 |
| 3 | 7.20E+03 | 0.0786 | −287 | 4 | 1.31E+06 | 14.3 | −287 |
| 5 | 1.11E+04 | 0.121 | −287 | 6 | 9.40E+05 | 10.3 | −287 |
| 7 | 1.45E+04 | 0.158 | −287 | 8 | 7.54E+05 | 8.22 | −287 |
| 9 | 1.75E+04 | 0.191 | −287 | 10 | 6.41E+05 | 6.99 | −287 |
| 11 | 2.02E+04 | 0.22 | −287 | 12 | 5.65E+05 | 6.17 | −287 |
| 13 | 2.26E+04 | 0.246 | −287 | 14 | 5.11E+05 | 5.57 | −287 |
| 15 | 2.48E+04 | 0.27 | −287 | 16 | 4.69E+05 | 5.12 | −287 |
| 17 | 2.68E+04 | 0.292 | −287 | 18 | 4.37E+05 | 4.76 | −287 |
| 19 | 2.86E+04 | 0.312 | −287 | 20 | 4.11E+05 | 4.48 | −287 |

15

N=10 Layers
$\{\sigma_+, \sigma_-\}, \{\kappa_+, \kappa_-\}, \{S, S\}$

| Layer | σ (S/m) | κ (W/m·K) | S (μV/K) | Layer | σ (S/m) | κ (W/m·K) | S (μV/K) |
|---|---|---|---|---|---|---|---|
| 1 | 2.41E+06 | 26.3 | −287 | 2 | 9.23E+03 | 0.101 | −287 |
| 3 | 9.40E+05 | 10.3 | −287 | 4 | 1.60E+04 | 0.175 | −287 |
| 5 | 6.41E+05 | 6.99 | −287 | 6 | 2.14E+04 | 0.234 | −287 |
| 7 | 5.11E+05 | 5.57 | −287 | 8 | 2.58E+04 | 0.281 | −287 |
| 9 | 4.37E+05 | 4.76 | −287 | 10 | 2.95E+04 | 0.322 | −287 |

$\{\sigma_+, \sigma_-\}, \{\kappa_+, \kappa_-\}, \{S, S\}$

| Layer | σ (S/m) | κ (W/m·K) | S (μV/K) | Layer | σ (S/m) | κ (W/m·K) | S (μV/K) |
|---|---|---|---|---|---|---|---|
| 1 | 5.01E+03 | 0.0547 | −287 | 2 | 1.31E+06 | 14.3 | −287 |
| 3 | 1.29E+04 | 0.14 | −287 | 4 | 7.54E+05 | 8.22 | −287 |
| 5 | 1.89E+04 | 0.206 | −287 | 6 | 5.65E+05 | 6.17 | −287 |
| 7 | 2.37E+04 | 0.259 | −287 | 8 | 4.69E+05 | 5.12 | −287 |
| 9 | 2.77E+04 | 0.302 | −287 | 10 | 4.11E+05 | 4.48 | −287 |

N=2 Layers
$\{\sigma_+, \sigma_-\}, \{\kappa_+, \kappa_-\}, \{S, S\}$

| Layer | σ (S/m) | κ (W/m·K) | S (μV/K) | Layer | σ (S/m) | κ (W/m·K) | S (μV/K) |
|---|---|---|---|---|---|---|---|
| 1 | 6.41E+05 | 6.99 | −287 | 2 | 2.95E+04 | 0.322 | −287 |

$\{\sigma_+, \sigma_-\}, \{\kappa_+, \kappa_-\}, \{S, S\}$

| Layer | σ (S/m) | κ (W/m·K) | S (μV/K) | Layer | σ (S/m) | κ (W/m·K) | S (μV/K) |
|---|---|---|---|---|---|---|---|
| 1 | 1.89E+04 | 0.206 | −287 | 2 | 4.11E+05 | 4.48 | −287 |

The results below are for CoSi with σ=6e5 S/m, κ=13 W/m·K, and S=−80 μV/K.

N=20 Layers
$\{\sigma_+, \sigma_-\}, \{\kappa_+, \kappa_-\}, \{S, S\}$

| Layer | σ (S/m) | κ (W/m·K) | S (μV/K) | Layer | σ (S/m) | κ (W/m·K) | S (μV/K) |
|---|---|---|---|---|---|---|---|
| 1 | 2.52E+07 | 546 | −80 | 2 | 2.73E+04 | 0.592 | −80 |
| 3 | 9.16E+06 | 198 | −80 | 4 | 5.04E+04 | 1.09 | −80 |

-continued

| Layer | σ (S/m) | κ (W/m · K) | S (μV/K) | Layer | σ (S/m) | κ (W/m · K) | S (μV/K) |
|---|---|---|---|---|---|---|---|
| 5 | 5.94E+06 | 129 | −80 | 6 | 7.02E+04 | 1.52 | −80 |
| 7 | 4.55E+06 | 98.6 | −80 | 8 | 8.75E+04 | 1.9 | −80 |
| 9 | 3.77E+06 | 81.7 | −80 | 10 | 1.03E+05 | 2.23 | −80 |
| 11 | 3.27E+06 | 70.9 | −80 | 12 | 1.17E+05 | 2.53 | −80 |
| 13 | 2.92E+06 | 63.3 | −80 | 14 | 1.29E+05 | 2.8 | −80 |
| 15 | 2.66E+06 | 57.7 | −80 | 16 | 1.41E+05 | 3.05 | −80 |
| 17 | 2.47E+06 | 53.4 | −80 | 18 | 1.51E+05 | 3.27 | −80 |
| 19 | 2.31E+06 | 50 | −80 | 20 | 1.61E+05 | 3.48 | −80 |

$\{\sigma_+, \sigma_-\}, \{\kappa_+, \kappa_-\}, \{S, S\}$

| Layer | σ (S/m) | κ (W/m · K) | S (μV/K) | Layer | σ (S/m) | κ (W/m · K) | S (μV/K) |
|---|---|---|---|---|---|---|---|
| 1 | 1.43E+04 | 0.31 | −80 | 2 | 1.32E+07 | 285 | −80 |
| 3 | 3.93E+04 | 0.851 | −80 | 4 | 7.15E+06 | 155 | −80 |
| 5 | 6.06E+04 | 1.31 | −80 | 6 | 5.13E+06 | 111 | −80 |
| 7 | 7.91E+04 | 1.71 | −80 | 8 | 4.11E+06 | 89.1 | −80 |
| 9 | 9.55E+04 | 2.07 | −80 | 10 | 3.50E+06 | 75.8 | −80 |
| 11 | 1.10E+05 | 2.38 | −80 | 12 | 3.08E+06 | 66.8 | −80 |
| 13 | 1.23E+05 | 2.67 | −80 | 14 | 2.79E+06 | 60.3 | −80 |
| 15 | 1.35E+05 | 2.93 | −80 | 16 | 2.56E+06 | 55.5 | −80 |
| 17 | 1.46E+05 | 3.16 | −80 | 18 | 2.38E+06 | 51.6 | −80 |
| 19 | 1.56E+05 | 3.38 | −80 | 20 | 2.24E+06 | 48.5 | −80 |

N=10 Layers
$\{\sigma_+, \sigma_-\}, \{\kappa_+, \kappa_-\}, \{S, S\}$

| Layer | σ (S/m) | κ (W/m · K) | S (μV/K) | Layer | σ (S/m) | κ (W/m · K) | S (μV/K) |
|---|---|---|---|---|---|---|---|
| 1 | 1.32E+07 | 285 | −80 | 2 | 5.04E+04 | 1.09 | −80 |
| 3 | 5.13E+06 | 111 | −80 | 4 | 8.75E+04 | 1.9 | −80 |
| 5 | 3.50E+06 | 75.8 | −80 | 6 | 1.17E+05 | 2.53 | −80 |
| 7 | 2.79E+06 | 60.3 | −80 | 8 | 1.41E+05 | 3.05 | −80 |
| 9 | 2.38E+06 | 51.6 | −80 | 10 | 1.61E+05 | 3.48 | −80 |

$\{\sigma_+, \sigma_-\}, \{\kappa_+, \kappa_-\}, \{S, S\}$

| Layer | σ (S/m) | κ (W/m · K) | S (μV/K) | Layer | σ (S/m) | κ (W/m · K) | S (μV/K) |
|---|---|---|---|---|---|---|---|
| 1 | 2.73E+04 | 0.592 | −80 | 2 | 7.15E+06 | 155 | −80 |
| 3 | 7.02E+04 | 1.52 | −80 | 4 | 4.11E+06 | 89.1 | −80 |
| 5 | 1.03E+05 | 2.23 | −80 | 6 | 3.08E+06 | 66.8 | −80 |
| 7 | 1.29E+05 | 2.8 | −80 | 8 | 2.56E+06 | 55.5 | −80 |
| 9 | 1.51E+05 | 3.27 | −80 | 10 | 2.24E+06 | 48.5 | −80 |

N=2 Layers
$\{\sigma_+, \sigma_-\}, \{\kappa_+, \kappa_-\}, \{S, S\}$

| Layer | σ (S/m) | κ (W/m · K) | S (μV/K) | Layer | σ (S/m) | κ (W/m · K) | S (μV/K) |
|---|---|---|---|---|---|---|---|
| 1 | 3.50E+06 | 75.8 | −80 | 2 | 1.61E+05 | 3.48 | −80 |

$\{\sigma_+, \sigma_-\}, \{\kappa_+, \kappa_-\}, \{S, S\}$

| Layer | σ (S/m) | κ (W/m · K) | S (μV/K) | Layer | σ (S/m) | κ (W/m · K) | S (μV/K) |
|---|---|---|---|---|---|---|---|
| 1 | 1.03E+05 | 2.23 | −80 | 2 | 2.24E+06 | 48.5 | −80 |

The results below are for $Na_xCoO_2$ with σ=5e5 S/m, κ=5 W/m·K, and S=100 μV/K.

N=20 Layers $\{\sigma_+, \sigma_-\}, \{\kappa_+, \kappa_-\}, \{S, S\}$

| Layer | σ (S/m) | κ (W/m · K) | S (μV/K) | Layer | σ (S/m) | κ (W/m · K) | S (μV/K) |
|---|---|---|---|---|---|---|---|
| 1 | 2.10E+07 | 210 | 100 | 2 | 2.28E+04 | 0.228 | 100 |
| 3 | 7.63E+06 | 76.3 | 100 | 4 | 4.20E+04 | 0.42 | 100 |
| 5 | 4.95E+06 | 49.5 | 100 | 6 | 5.85E+04 | 0.585 | 100 |
| 7 | 3.79E+06 | 37.9 | 100 | 8 | 7.29E+04 | 0.729 | 100 |
| 9 | 3.14E+06 | 31.4 | 100 | 10 | 8.58E+04 | 0.858 | 100 |
| 11 | 2.73E+06 | 27.3 | 100 | 12 | 9.73E+04 | 0.973 | 100 |
| 13 | 2.44E+06 | 24.4 | 100 | 14 | 1.08E+05 | 1.08 | 100 |
| 15 | 2.22E+06 | 22.2 | 100 | 16 | 1.17E+05 | 1.17 | 100 |
| 17 | 2.05E+06 | 20.5 | 100 | 18 | 1.26E+05 | 1.26 | 100 |
| 19 | 1.92E+06 | 19.2 | 100 | 20 | 1.34E+05 | 1.34 | 100 |

$\{\sigma_+, \sigma_-\}, \{\kappa_+, \kappa_-\}, \{S, S\}$

| Layer | σ (S/m) | κ (W/m · K) | S (μV/K) | Layer | σ (S/m) | κ (W/m · K) | S (μV/K) |
|---|---|---|---|---|---|---|---|
| 1 | 1.19E+04 | 0.119 | 100 | 2 | 1.10E+07 | 110 | 100 |
| 3 | 3.27E+04 | 0.327 | 100 | 4 | 5.96E+06 | 59.6 | 100 |
| 5 | 5.05E+04 | 0.505 | 100 | 6 | 4.27E+06 | 42.7 | 100 |
| 7 | 6.59E+04 | 0.659 | 100 | 8 | 3.43E+06 | 34.3 | 100 |
| 9 | 7.96E+04 | 0.796 | 100 | 10 | 2.91E+06 | 29.1 | 100 |
| 11 | 9.17E+04 | 0.917 | 100 | 12 | 2.57E+06 | 25.7 | 100 |
| 13 | 1.03E+05 | 1.03 | 100 | 14 | 2.32E+06 | 23.2 | 100 |
| 15 | 1.13E+05 | 1.13 | 100 | 16 | 2.13E+06 | 21.3 | 100 |
| 17 | 1.22E+05 | 1.22 | 100 | 18 | 1.99E+06 | 19.9 | 100 |
| 19 | 1.30E+05 | 1.3 | 100 | 20 | 1.87E+06 | 18.7 | 100 |

N=10 Layers $\{\sigma_+, \sigma_-\}, \{\kappa_+, \kappa_-\}, \{S, S\}$

| Layer | σ (S/m) | κ (W/m · K) | S (μV/K) | Layer | σ (S/m) | κ (W/m · K) | S (μV/K) |
|---|---|---|---|---|---|---|---|
| 1 | 1.10E+07 | 110 | 100 | 2 | 4.20E+04 | 0.42 | 100 |
| 3 | 4.27E+06 | 42.7 | 100 | 4 | 7.29E+04 | 0.729 | 100 |
| 5 | 2.91E+06 | 29.1 | 100 | 6 | 9.73E+04 | 0.973 | 100 |
| 7 | 2.32E+06 | 23.2 | 100 | 8 | 1.17E+05 | 1.17 | 100 |
| 9 | 1.99E+06 | 19.9 | 100 | 10 | 1.34E+05 | 1.34 | 100 |

$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 2.28E+04 | 0.228 | 100 |
| 2 | 5.96E+06 | 59.6 | 100 |
| 3 | 5.85E+04 | 0.585 | 100 |
| 4 | 3.43E+06 | 34.3 | 100 |
| 5 | 8.58E+04 | 0.858 | 100 |
| 6 | 2.57E+06 | 25.7 | 100 |
| 7 | 1.08E+05 | 1.08 | 100 |
| 8 | 2.13E+06 | 21.3 | 100 |
| 9 | 1.26E+05 | 1.26 | 100 |
| 10 | 1.87E+06 | 18.7 | 100 |

N=2 Layers
$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 2.91E+06 | 29.1 | 100 |
| 2 | 1.34E+05 | 1.34 | 100 |

$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 8.58E+04 | 0.858 | 100 |
| 2 | 1.87E+06 | 18.7 | 100 |

The results below are for $Sb_2Te_3$ with σ=3.1e5 S/m, κ=1.6 W/m·K, and S=92 μV/K.

N=20 Layers
$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 1.30E+07 | 67.2 | 92 |
| 2 | 1.41E+04 | 0.0729 | 92 |
| 3 | 4.73E+06 | 24.4 | 92 |
| 4 | 2.60E+04 | 0.134 | 92 |
| 5 | 3.07E+06 | 15.8 | 92 |
| 6 | 3.63E+04 | 0.187 | 92 |
| 7 | 2.35E+06 | 12.1 | 92 |
| 8 | 4.52E+04 | 0.233 | 92 |
| 9 | 1.95E+06 | 10.1 | 92 |
| 10 | 5.32E+04 | 0.275 | 92 |
| 11 | 1.69E+06 | 8.72 | 92 |
| 12 | 6.03E+04 | 0.311 | 92 |
| 13 | 1.51E+06 | 7.79 | 92 |
| 14 | 6.68E+04 | 0.345 | 92 |
| 15 | 1.38E+06 | 7.11 | 92 |
| 16 | 7.27E+04 | 0.375 | 92 |
| 17 | 1.27E+06 | 6.58 | 92 |
| 18 | 7.81E+04 | 0.403 | 92 |
| 19 | 1.19E+06 | 6.15 | 92 |
| 20 | 8.31E+04 | 0.429 | 92 |

$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 7.39E+03 | 0.0381 | 92 |
| 2 | 6.81E+06 | 35.1 | 92 |
| 3 | 2.03E+04 | 0.105 | 92 |
| 4 | 3.69E+06 | 19.1 | 92 |
| 5 | 3.13E+04 | 0.162 | 92 |
| 6 | 2.65E+06 | 13.7 | 92 |
| 7 | 4.09E+04 | 0.211 | 92 |
| 8 | 2.12E+06 | 11 | 92 |
| 9 | 4.93E+04 | 0.255 | 92 |
| 10 | 1.81E+06 | 9.33 | 92 |
| 11 | 5.68E+04 | 0.293 | 92 |
| 12 | 1.59E+06 | 8.22 | 92 |
| 13 | 6.36E+05 | 0.328 | 92 |
| 14 | 1.44E+06 | 7.43 | 92 |
| 15 | 6.98E+05 | 0.36 | 92 |
| 16 | 1.32E+06 | 6.82 | 92 |
| 17 | 7.54E+05 | 0.389 | 92 |
| 18 | 1.23E+06 | 6.35 | 92 |
| 19 | 8.06E+05 | 0.416 | 92 |
| 20 | 1.16E+06 | 8.97 | 92 |

N=10 Layers
$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 6.81E+06 | 35.1 | 92 |
| 2 | 2.60E+04 | 0.134 | 92 |
| 3 | 2.65E+06 | 13.7 | 92 |
| 4 | 4.52E+04 | 0.233 | 92 |
| 5 | 1.81E+06 | 9.33 | 92 |
| 6 | 6.03E+04 | 0.311 | 92 |
| 7 | 1.44E+06 | 7.43 | 92 |
| 8 | 7.27E+04 | 0.375 | 92 |
| 9 | 1.23E+06 | 6.35 | 92 |
| 10 | 8.31E+04 | 0.429 | 92 |

$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 1.41E+04 | 0.0729 | 92 |
| 2 | 3.69E+06 | 19.1 | 92 |
| 3 | 3.63E+04 | 0.187 | 92 |
| 4 | 2.12E+06 | 11 | 92 |
| 5 | 5.32E+04 | 0.275 | 92 |
| 6 | 1.59E+06 | 8.22 | 92 |
| 7 | 6.68E+04 | 0.345 | 92 |
| 8 | 1.32E+06 | 6.82 | 92 |
| 9 | 7.81E+04 | 0.403 | 92 |
| 10 | 1.16E+06 | 5.97 | 92 |

N=2 Layers
$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 1.81E+06 | 9.33 | 92 |
| 2 | 8.31E+04 | 0.429 | 92 |

$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 5.32E+04 | 0.275 | 92 |
| 2 | 1.16E+06 | 5.97 | 92 |

The results below are for $Zn_{0.98}Al_{0.02}$ with σ=6e4 S/m, κ=40 W/m·K, and S=−164 μV/K.

N=20 Layers
$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 2.52E+06 | 1.68E+03 | −164 |
| 2 | 2.73E+03 | 1.82 | −164 |
| 3 | 9.16E+05 | 611 | −164 |
| 4 | 5.04E+03 | 3.36 | −164 |
| 5 | 5.94E+05 | 396 | −164 |
| 6 | 7.02E+05 | 4.68 | −164 |
| 7 | 4.55E+05 | 303 | −164 |
| 8 | 8.75E+03 | 5.84 | −164 |
| 9 | 3.77E+05 | 251 | −164 |
| 10 | 1.03E+04 | 6.86 | −164 |
| 11 | 3.27E+05 | 218 | −164 |

-continued

| Layer | σ (S/m) | κ (W/m · K) | S (μV/K) |
|---|---|---|---|
| 12 | 1.17E+04 | 7.78 | −164 |
| 13 | 2.92E+05 | 195 | −164 |
| 14 | 1.29E+04 | 8.62 | −164 |
| 15 | 2.66E+05 | 178 | −164 |
| 16 | 1.41E+04 | 9.38 | −164 |
| 17 | 2.47E+05 | 164 | −164 |
| 18 | 1.51E+04 | 10.1 | −164 |
| 19 | 2.31E+05 | 154 | −164 |
| 20 | 1.61E+04 | 10.7 | −164 |

$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 1.43E+03 | 0.953 | −164 |
| 2 | 1.32E+06 | 878 | −164 |
| 3 | 3.93E+03 | 2.62 | −164 |
| 4 | 7.15E+05 | 477 | −164 |
| 5 | 6.06E+03 | 4.04 | −164 |
| 6 | 5.13E+05 | 342 | −164 |
| 7 | 7.91E+03 | 5.28 | −164 |
| 8 | 4.11E+05 | 274 | −164 |
| 9 | 9.55E+03 | 6.36 | −164 |
| 10 | 3.50E+05 | 233 | −164 |
| 11 | 1.10E+04 | 7.34 | −164 |
| 12 | 3.08E+05 | 206 | −164 |
| 13 | 1.23E+04 | 8.21 | −164 |
| 14 | 2.79E+05 | 186 | −164 |
| 15 | 1.35E+04 | 9.01 | −164 |
| 16 | 2.56E+05 | 171 | −164 |
| 17 | 1.46E+04 | 9.73 | −164 |
| 18 | 2.38E+05 | 159 | −164 |
| 19 | 1.56E+04 | 10.4 | −164 |
| 20 | 2.24E+05 | 149 | −164 |

N=10 Layers
$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 1.32E+06 | 878 | −164 |
| 2 | 5.04E+03 | 3.36 | −164 |
| 3 | 5.13E+05 | 342 | −164 |
| 4 | 8.75E+03 | 5.84 | −164 |
| 5 | 3.50E+05 | 233 | −164 |
| 6 | 1.17E+04 | 7.78 | −164 |
| 7 | 2.79E+05 | 186 | −164 |
| 8 | 1.41E+04 | 9.38 | −164 |
| 9 | 2.38E+05 | 159 | −164 |
| 10 | 1.61E+04 | 10.7 | −164 |

$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 2.73E+03 | 1.82 | −164 |
| 2 | 7.15E+05 | 477 | −164 |
| 3 | 7.02E+03 | 4.68 | −164 |
| 4 | 4.11E+05 | 274 | −164 |
| 5 | 1.03E+04 | 6.86 | −164 |
| 6 | 3.08E+05 | 206 | −164 |
| 7 | 1.29E+04 | 8.62 | −164 |
| 8 | 2.56E+05 | 171 | −164 |
| 9 | 1.51E+04 | 10.1 | −164 |
| 10 | 2.24E+05 | 149 | −164 |

N=2 Layers
$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 3.50E+05 | 233 | −164 |
| 2 | 1.61E+04 | 10.7 | −164 |

$\{\sigma_+, \sigma_-\}, \{\kappa_+, \kappa_-\}, \{S, S\}$

| Layer | σ (S/m) | κ (W/m · K) | S (μV/K) |
|---|---|---|---|
| 1 | 1.03E+04 | 6.86 | −164 |
| 2 | 2.24E+05 | 149 | −164 |

Disclosed herein, among other things, is that electric and thermal transport coupled via thermoelectric phenomena can be manipulated according to virtual spatial distortions. Utilizing the form invariance of the underlying equations under coordinate transformations, the desired distortions are mapped into anisotropic and inhomogeneous thermoelectric properties of the materials. These ideas are applied to thermoelectric cloaking, which constitutes a significant step forward towards accessing multiphysics transformations with coupling between the domains. Further benefits can be drawn by realizing that the designed layered multifunctional metamaterials can operate as thermal or electric cloaks and are independent of the boundary conditions of operation. The several options for the materials and dependence on a variety of geometrical factors give pathways for property optimizations, making TE cloaks practically possible.

Various features and advantages of the invention are set forth in the following claims.

What is claimed is:

1. A thermoelectric cloak comprising:
   an inner region of the thermoelectric cloak, wherein the inner region has an annular shape having an inner radius and an outer radius, wherein the inner region comprises a metamaterial composite having concentric bilayers, wherein an individual concentric bilayer comprises a first layer and a second layer surrounding the first layer, wherein the first and second layers are different homogenous layers; and
   an external medium of the thermoelectric cloak, wherein the external medium is located outside the outer radius of the inner radius;
   wherein the inner region has a thermoelectric cloaking effect that isolates an interior cavity surrounded by the inner radius from heat and electric charge fluxes coupled via thermoelectricity in the external medium, wherein heat, electric currents, and gradients in the external medium of the thermoelectric cloak are unaltered by the thermoelectric cloaking effect of the inner region of the thermoelectric cloak.

2. The thermoelectric cloak of claim 1, wherein the cloak has properties of a thermal cloak in the presence of only an external temperature difference across the external medium, wherein the cloak has properties of an electric cloak in the presence of only an external electric difference across the external medium, and wherein the cloak has properties of a bifunctional cloak when the external medium has a negligibly small Seebeck coefficient.

3. The thermoelectric cloak of claim 1, wherein the cloaking effect is unaffected by boundary conditions.

4. The thermoelectric cloak of claim 1 wherein the thickness of the bilayers is substantially small compared to the inner radius of the inner region.

5. The thermoelectric cloak of claim 1, wherein the metamaterial composite comprises $Bi_2Te_3$, CoSi, $Sb_2Te_3$, $Zn_{0.98}Al_{0.02}O$, $Na_xCoO_2$, or a combination thereof.

6. The thermoelectric cloak of claim 1, wherein the number of concentric bilayers of the inner region is less than or equal to 10.

7. The thermoelectric cloak of claim 1, wherein the number of concentric bilayers of the inner region is greater than or equal to 10.

8. An article comprising the thermoelectric cloak of claim 1.

9. The article of claim 8, wherein the article is a solar cell or a thermoelectric device.

10. The thermoelectric cloak of claim 1, wherein the individual concentric bilayer comprises two layers of equal thickness.

11. The thermoelectric cloak of claim 1, wherein Seebeck coefficients of the first and second layers are the same.

12. The thermoelectric cloak of claim 1, wherein Seebeck coefficients of the first and second layers are different.

13. A method comprising:

fabricating a thermoelectric cloak having an inner region and an external medium of the thermoelectric cloak, wherein the inner region has an annular shape having an inner radius and an outer radius, wherein the inner region comprises a metamaterial composite having concentric bilayers, wherein an individual concentric bilayer comprises a first layer and a second layer surrounding the first layer, wherein the first and second layers are different homogenous layers, wherein the external medium is located outside the outer radius of the inner radius; and isolating an object from a thermoelectric flow in the external medium by positioning the object within an interior cavity surrounded by the inner radius of the inner region, wherein the inner region has a thermoelectric cloaking effect that isolates the interior cavity surrounded by the inner radius from heat and electric charge fluxes coupled via thermoelectricity in the external medium, wherein heat, electric currents, and gradients in the external medium of the thermoelectric cloak are unaltered by the thermoelectric cloaking effect of the inner region of the thermoelectric cloak.

14. The method of claim 13, wherein Seebeck coefficients of the first and second layers are the same.

15. The method of claim 13, wherein Seebeck coefficients of the first and second layers are different.

16. The method of claim 13, wherein the individual concentric bilayer comprises two layers of equal thickness.

* * * * *